United States Patent
Bian et al.

(10) Patent No.: US 11,340,403 B2
(45) Date of Patent: May 24, 2022

(54) PHOTONIC COMPONENT WITH DISTRIBUTED BRAGG REFLECTORS

(71) Applicant: GLOBALFOUNDRIES U.S. Inc., Santa Clara, CA (US)

(72) Inventors: Yusheng Bian, Ballston, NY (US); Ajey Poovannummoottil Jacob, Watervliet, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 42 days.

(21) Appl. No.: 16/807,942

(22) Filed: Mar. 3, 2020

(65) Prior Publication Data
US 2021/0278598 A1  Sep. 9, 2021

(51) Int. Cl.
| | |
|---|---|
| *G02B 6/35* | (2006.01) |
| *G02B 6/293* | (2006.01) |
| *G02B 6/36* | (2006.01) |
| *G02B 6/42* | (2006.01) |
| *G02B 6/12* | (2006.01) |
| *G02B 6/122* | (2006.01) |

(52) U.S. Cl.
CPC ....... *G02B 6/3512* (2013.01); *G02B 6/12004* (2013.01); *G02B 6/29359* (2013.01); *G02B 6/3608* (2013.01); *G02B 6/4283* (2013.01); *G02B 6/1228* (2013.01); *G02B 2006/12104* (2013.01)

(58) Field of Classification Search
CPC .............. G02B 6/29359; G02B 6/3512; G02B 6/3608; G02B 6/4283; G02B 2006/12104
See application file for complete search history.

(56) References Cited

U.S. PATENT DOCUMENTS

| | | | | |
|---|---|---|---|---|
| 5,767,507 A | * | 6/1998 | Unlu | ........................ G01J 4/04 |
| | | | | 250/214.1 |
| 6,380,531 B1 | * | 4/2002 | Sugihwo | ............... G01J 3/0256 |
| | | | | 250/214.1 |
| 7,501,303 B2 | * | 3/2009 | Unlu | ................... H01L 31/0392 |
| | | | | 257/E33.069 |
| 7,616,904 B1 | | 11/2009 | Gunn, III et al. | |

(Continued)

OTHER PUBLICATIONS

M. K. Emsley, et al., "Silicon substrates with buried distributed Bragg reflectors for resonant cavity-enhanced optoelectronics," in IEEE Journal of Selected Topics in Quantum Electronics, vol. 8, No. 4, pp. 948-955, Jul.-Aug. 2002. (Year: 2002).*

(Continued)

*Primary Examiner* — Daniel Petkovsek
(74) *Attorney, Agent, or Firm* — Yee Tze Lim; Hoffman Warnick LLC

(57) ABSTRACT

One illustrative device disclosed herein includes a layer of semiconductor material and a first Bragg reflector structure positioned in the layer of semiconductor material, wherein the first Bragg reflector structure comprises a plurality of dielectric elements and a first internal area defined by an innermost of the first plurality of dielectric elements. In this example, the device also includes an optical component positioned above the layer of semiconductor material, wherein at least a portion of the optical component is positioned within a vertical projection of the first internal area.

20 Claims, 24 Drawing Sheets

(56) References Cited

U.S. PATENT DOCUMENTS

| | | | | |
|---|---|---|---|---|
| 8,330,171 | B2* | 12/2012 | Dosunmu | H01L 31/103 |
| | | | | 257/82 |
| 10,429,582 | B1 | 10/2019 | Bian et al. | |
| 10,818,807 | B2* | 10/2020 | Jacob | G02B 1/113 |
| 2003/0103542 | A1* | 6/2003 | Cox | H01S 5/18355 |
| | | | | 372/96 |
| 2016/0170141 | A1* | 6/2016 | Luo | G02B 6/124 |
| | | | | 385/14 |
| 2017/0345952 | A1* | 11/2017 | Yashiki | H01L 31/1075 |

OTHER PUBLICATIONS

U.S. Appl. No. 16/253,191, filed Jan. 21, 2019, entitlted "Semiconductor Detectors Integrated with Bragg Reflectors and Methods of Forming Same".

U.S. Appl. No. 16/540,452, filed Aug. 14, 2019, entitled "Bragg Gratings with Airgap Cladding".

U.S. Appl. No. 16/544,866, filed Aug. 19, 2019, entitled "Semiconductor Detectors with Butt-End Coupled Waveguide and Method of Forming the Same".

Ang et al., "Germanium Photodetector Technologies for Optical Communication Applications," Semiconductor Technologies, Chapter 16, pp. 373-406, Publisher Intech, Apr. 2010.

Assefa et al., "CMOS-Integrated 40GHz Germanium Waveguide Photodetector for On-Chip Optical Interconnects," 978-1-55752-865-0/09, 2009 IEEE.

Chen et al., "-1 V bias 67 GHz bandwidth Si-contacted germanium waveguide p-i-n photodetector for optical links at 56 GPS and beyond," Optics Express, 24:4622-31, Mar. 7, 2016.

Cui and Zhou, "High-performance Ge-on-Si photodetector with optimized DBR location," Optics Letters, 42:5141-44, Dec. 15, 2017.

Giewont et al., "300-mm Monolithic Silicon Photonics Foundry Technology," IEEE Journal of Selected Topics in Quantum Electronics, 25:8200611, Apr. 2019.

Li et al., "Improving CMOS-compatible Germanium photodetectors," Optics Express, 20:26345-50, Nov. 19, 2012.

Piels and Bowers, "Photodetectors for silicon photonic integrated circuits," Elsevier Ltd., 2016.

Preston et al., "Waveguide-integrated telecom-wavelength photodiode in deposited silicon," Optics Letters, 36:52-54, Jan. 1, 2011.

Virot et al., "Integrated waveguide PIN photodiodes exploiting lateral Si/Ge/Si heterojunction," Optics Express, 25:19487-96, 2017.

* cited by examiner

PHOTONIC COMPONENT WITH DISTRIBUTED BRAGG REFLECTORS

BACKGROUND

Field of the Invention

The present disclosure generally relates to various novel embodiments of a photonic component with distributed Bragg reflectors and various novel methods of making such a device.

Description of the Related Art

There are many types of optical components in a typical fiber optics communications system, e.g., photodetectors, waveguides, light couplers, splitters, filters, etc. The function of the photodetector element in a fiber optics communication system is to convert optical power into electrical voltage or current. The most common photodetector used in fiber optics applications is the semiconductor photodetector. There are many other applications where a photodetector may be employed, e.g., radiation detection, smoke detection, flame detection and to switch on relays for street lighting, etc. When incident light from, for example, a laser or an optical fiber irradiates the photodetector, light photons in the incident light are absorbed by the photodetector. The absorption of the light photons results in the creation of electron-hole pairs in the depletion region of the photodetector.

The present disclosure is generally directed to various novel embodiments of a photonic component with distributed Bragg reflectors and various novel methods of making such a device.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel embodiments of a photonic component with distributed Bragg reflectors and various novel methods of making such a device. One illustrative device disclosed herein includes a layer of semiconductor material and a first Bragg reflector structure positioned in the layer of semiconductor material, wherein the first Bragg reflector structure comprises a plurality of dielectric elements and a first internal area defined by an innermost of the first plurality of dielectric elements. In this example, the device also includes an optical component positioned above the layer of semiconductor material wherein at least a portion of the optical component is positioned within a vertical projection of the first internal area.

BRIEF DESCRIPTION OF THE DRAWINGS

The disclosure may be understood by reference to the following description taken in conjunction with the accompanying drawings, in which like reference numerals identify like elements, and in which.

Figure 1:
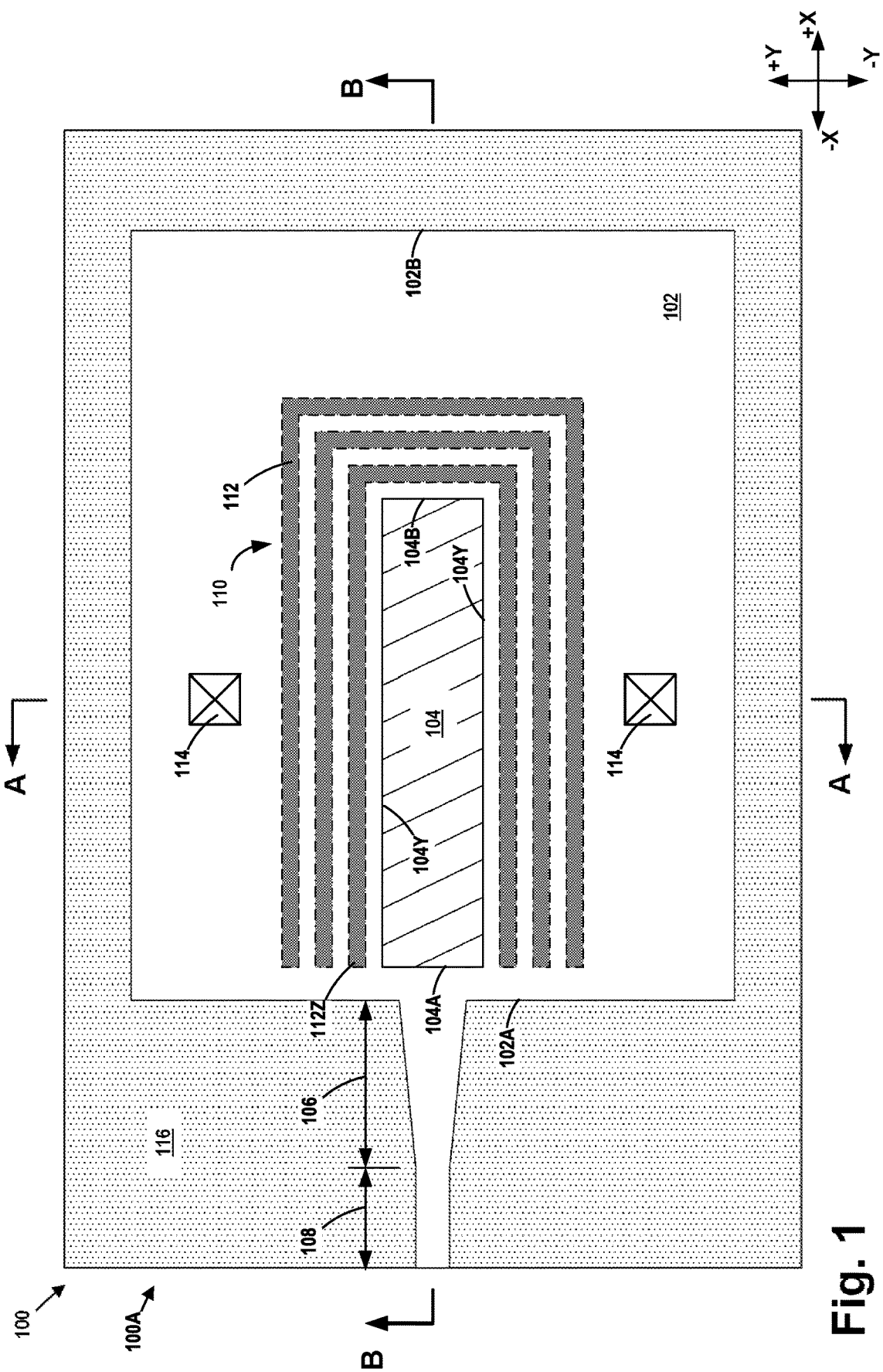
FIGS. 1-24 depict various novel embodiments of a photonic component with distributed Bragg reflectors and various novel methods of making such a device. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

FIGS. 1-24 depict various novel embodiments of a photonic component 100 with distributed Bragg reflectors and various novel methods of making such a device. For each of the illustrative embodiments of the photonic components 100 disclosed herein, a plan (top-down) view and two cross-sectional views (A-A and B-B) will be provided. The drawings also include reference directions (X, Y and Z) in the lower right-hand corner of the drawings. The cross-sectional views are taken where indicated in the plan view. More specifically, the cross-sectional view is taken through the photonic component 100 in the Y direction that is transverse to a long axis (in the X direction) of the photonic component 100 (and transverse to the direction of light propagation (in the X direction) through the photonic component 100) while the cross-sectional view B-B is taken through the axial length of the photonic component 100 in the X direction (and parallel to the direction of light propagation (in the X direction) through the photonic component 100). Various layers of insulating material that are depicted in the cross-sectional views are not depicted in the plan views so as to facilitate explanation of the subject matter disclosed herein.

As will be appreciated by those skilled in the art after a complete reading of the present application, the photonic component 100 may be any type of component that is adapted for use in an optical system, and it may be a passive or active device, e.g., a photodetector, a coupler, a modulator, a waveguide, a splitter, a filter, etc. Moreover, the photonic component 100 may be adapted to perform at least one of the functions of light coupling, light propagation, light absorption and conversion of light to an electrical current, i.e., photocurrent, in such an optical system.

In the depicted examples, the photonic component 100 will be formed above a semiconductor substrate 101. The substrate 101 may have a variety of configurations, such as a semiconductor-on-insulator (SOI) shown herein. Such an SOI substrate 101 includes a base semiconductor layer 101A, a buried insulation layer 101B positioned on the base semiconductor layer 101A and an active semiconductor layer 101C positioned above the buried insulation layer 101B, wherein the photonic component 100 will be formed in and above the active semiconductor layer 101C. The thickness of the active semiconductor layer 101C and the buried insulation layer 101B may vary depending upon the particular application. In one illustrative embodiment, the active semiconductor layer 101C may be substantially free of any appreciable amount of dopant material, i.e., the active semiconductor layer 101C may be an intrinsic semiconductor material. The active semiconductor layer 101C and the base semiconductor layer 101A need not be made of the same semiconductor material, but that may be the case in some applications. In some applications, the active semiconductor layer 101C and the base semiconductor layer 101A may be made of silicon or they may be made of semiconductor materials other than silicon. Thus, the terms "substrate" or "semiconductor substrate" should be understood to cover all semiconductor materials and all forms of such materials. The buried insulation layer 101B may comprise any desired insulating material, e.g., silicon dioxide, silicon nitride, etc.

Figure 2:
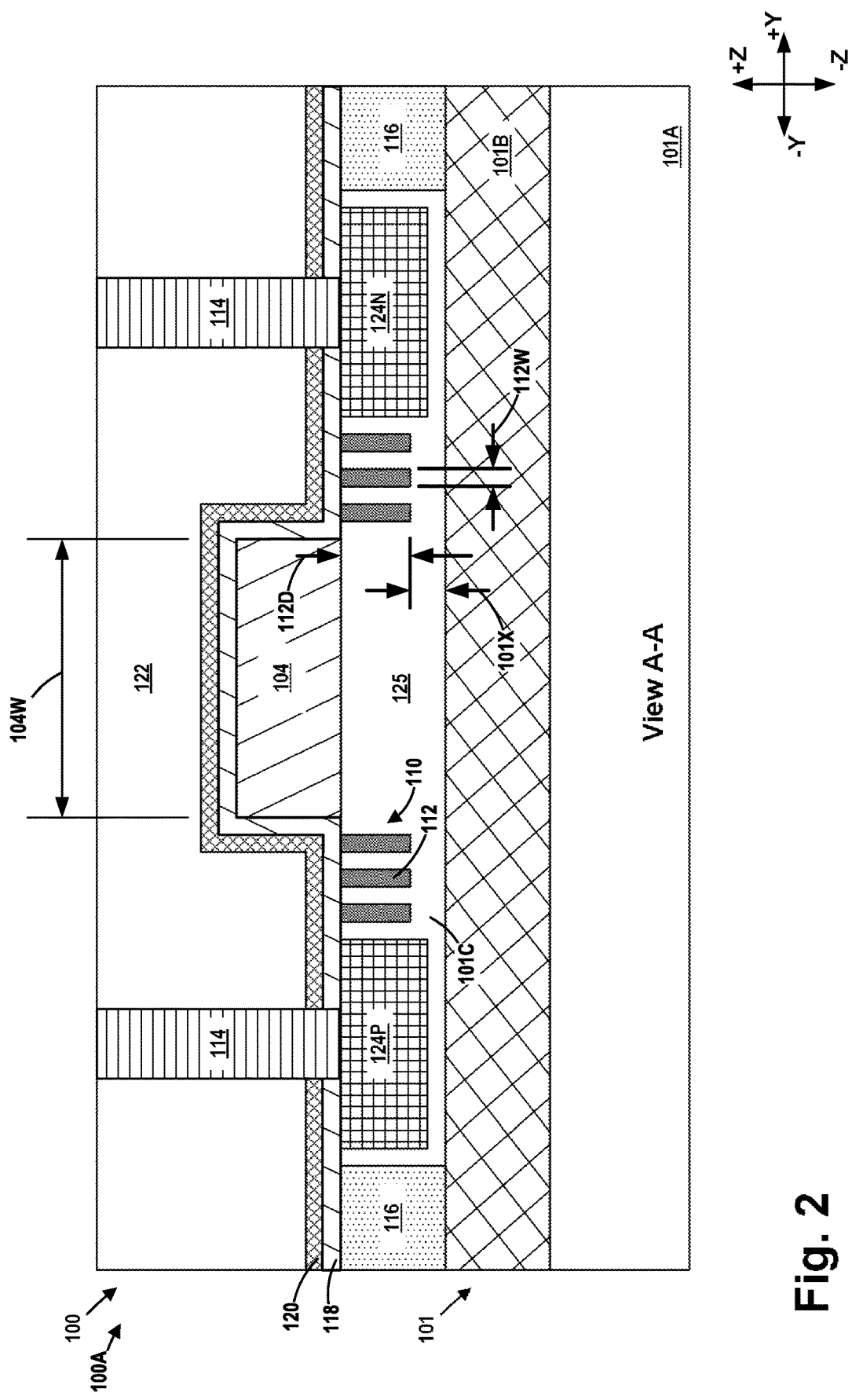
Figure 3:
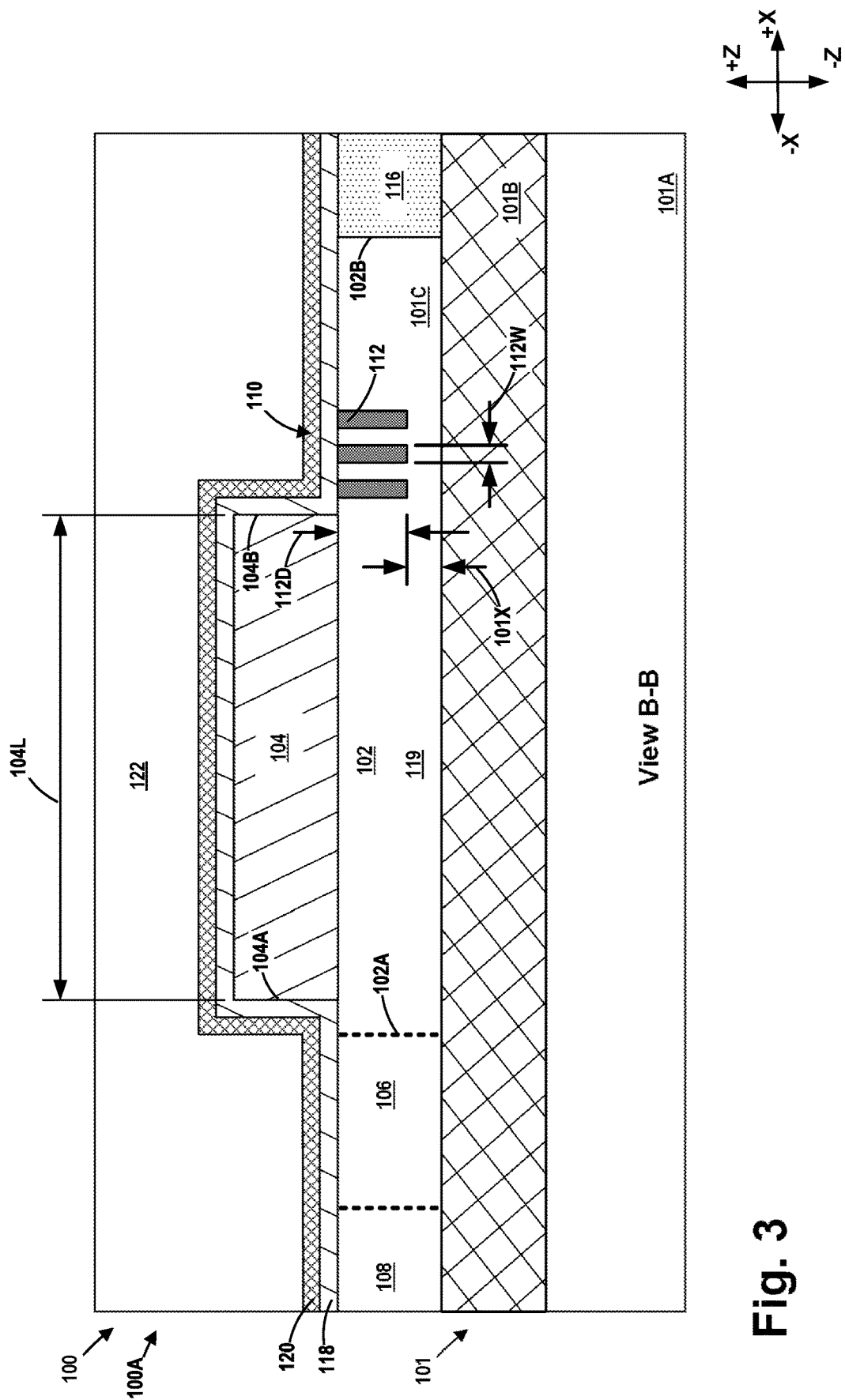

FIGS. 1-3 depict one illustrative embodiment of the photonic component 100 wherein the photonic component 100 is a photodetector 100A. As depicted, the illustrative photodetector 100A comprises an active layer 102 (formed from the active semiconductor layer 101C) and an intrinsic absorption region 104 positioned above the active layer 102. Also depicted in FIG. 1 is an illustrative tapered waveguide 106 and a waveguide 108. A distributed Bragg reflector 110 comprised of a plurality of dielectric elements 112 that are formed in the active semiconductor layer 101C are also depicted in the drawings.

Also depicted in the drawings are a plurality of conductive contacts 114, an insulating material 116, e.g., silicon dioxide, a layer of insulating material 118, e.g., silicon dioxide, a layer of insulating material 120, e.g., silicon nitride, and a representative one or more layers of insulating material 122. In a real-world device, the one or more layers of insulating material 122 may comprise multiple layers of material and the layers of material may be made of different materials. For example, the one or more layers of insulating material 122 may comprise one of more layers of silicon dioxide with a layer of silicon nitride (which functions as an etch stop layer) positioned between the layers of silicon dioxide. The structure, composition and techniques used to form such layer(s) of insulating material 122 are well known to those skilled in the art.

As shown in FIG. 2, e.g., a PIN diode was formed in the active semiconductor layer 101C of the substrate 101, i.e., the active layer 102 of the photodetector 100A. Of course, other forms of diodes (e.g., avalanche photodetector, etc.) could be formed in the active layer 102. In one illustrative embodiment, the diode comprises a P-doped region 124P and an N-doped region 124N (collectively referenced using the numeral 124) and an intrinsic region 125, i.e., a region that is substantially free of dopant material, positioned between the P-doped region 124P and the N-doped region 124N. The doped regions 124 may be formed by performing traditional masking and ion implantation techniques. The maximum concentration of dopant atoms in the doped regions 124 may vary depending upon the particular application, e.g., 1E18-1E20 ions/cm$^3$. The location of the peak concentration of dopant atoms within the vertical thickness of the doped regions 124 may also vary depending upon the particular application. The physical dimensions, i.e., length (in the X direction), width (in the Y direction) and depth (in the Z direction), of the doped regions 124 and the intrinsic region 125 may all vary depending upon the particular application. The P-doped region 124P may be doped with any species of P-type dopant, e.g., boron, boron difluoride, etc. The N-doped region 124N may be doped with any species of N-type dopant, e.g., arsenic, phosphorus, etc. As depicted, the conductive contacts 114 are conductively coupled to the doped regions 124 of the diode. The conductive contacts 114 may be comprised of any conductive material and they may be formed by performing a variety of known manufacturing techniques.

The active layer 102 has a front surface 102A and a rear surface 102B. The intrinsic absorption region 104 has a front surface 104A, a rear surface 104B, side surfaces 104Y, a lateral width 104W (see FIG. 2) and an axial length 104L (see FIG. 3). The physical dimensions (i.e., length, width and thickness) of the active layer 102 and the intrinsic absorption region 104 may vary depending upon the particular application. The active layer 102 of the photodetector 100A may be comprised of any desired material, e.g., silicon, silicon germanium, germanium, etc. The intrinsic absorption region 104 of the photodetector 100A may be comprised of any desired material, e.g., silicon-germanium, germanium, silicon, etc.

In the example shown in FIG. 1, the distributed Bragg reflector 110 comprises three generally U-shaped (when viewed from above) dielectric elements 112 that are formed in the active layer 102 of the photodetector 100A. In this embodiment, a vertical projection of the location of the underlying dielectric elements 112 reflects that the dielectric elements 112 are positioned around the side surfaces 104Y and the rear surface 104B of the intrinsic absorption region 104. Of course, as will be appreciated by those skilled in the art after a complete reading of the present application, the distributed Bragg reflector 110 may comprise any desired number of the dielectric elements 112 and the reflector elements may be of any desired configuration when viewed from above. The innermost surfaces of the innermost dielectric element 112Z of the Bragg reflector 110 define an area (with the understanding that the dielectric elements 112 only have three internal surfaces). Also note that at least a portion of the optical component 104 is positioned within a vertical (or upward) projection of the area defined by the innermost surfaces of the innermost dielectric element 112Z. In one illustrative example an entire outer perimeter of the intrinsic absorption region 104 is positioned within the vertical projection of the area defined by the innermost surfaces of the innermost dielectric element 112Z. Stated another way, in some embodiments, the area defined by the innermost surfaces of the innermost dielectric element 112Z is greater than an area defined by the outer perimeter of the intrinsic absorption region 104. In the example shown in FIG. 1, each of the dielectric elements 112 comprise a plurality of substantially linear segments that intersect one another.

With reference to FIGS. 2-3, the dielectric elements 112 have a depth 112D (in the Z direction) and a width 112W (in the X direction). The physical dimensions of the dielectric elements 112 and the spacing between adjacent dielectric elements 112 may vary depending upon the particular application. Moreover, the physical dimensions of all of the dielectric elements 112 in the Bragg reflector 110 and the spacing between adjacent dielectric elements 112 need not be uniform, but that may be the case in some applications. In the example depicted in FIGS. 1-3, the depth 112D of the dielectric elements 112 is less than the vertical thickness of the active semiconductor layer 101C of the substrate 101, leaving an amount 101X of the active semiconductor layer 101C positioned under the dielectric elements 112. In one illustrative embodiment, the depth 112D may range from about 10-200 nm, the width 112W may range from about 150-400 nm, the spacing between adjacent dielectric elements 112 may range from about 50-200 nm and the remaining thickness 101X of the active semiconductor layer 101C may be about 20-100 nm. In the depicted example, dielectric elements 112 comprise an insulating material such as, for example, silicon dioxide, silicon nitride, aluminum oxide, magnesium oxide, a material having a refractive index less than 1.6, etc. After the trenches for the dielectric elements 112 were formed in the active semiconductor layer 101C (by etching), the material of the dielectric elements 112 may be formed in the trenches by performing techniques known to those skilled in the art. The various embodiments of the photonic components 100 disclosed herein may be manufactured by performing a variety of different known manufacturing techniques performed in a variety of different processing flows, all of which are known to those skilled in the art. In the embodiments of the photonic component 100 discussed below, the use of the same reference number for various structures will be understood to refer to the previously described structures.

Figure 4:
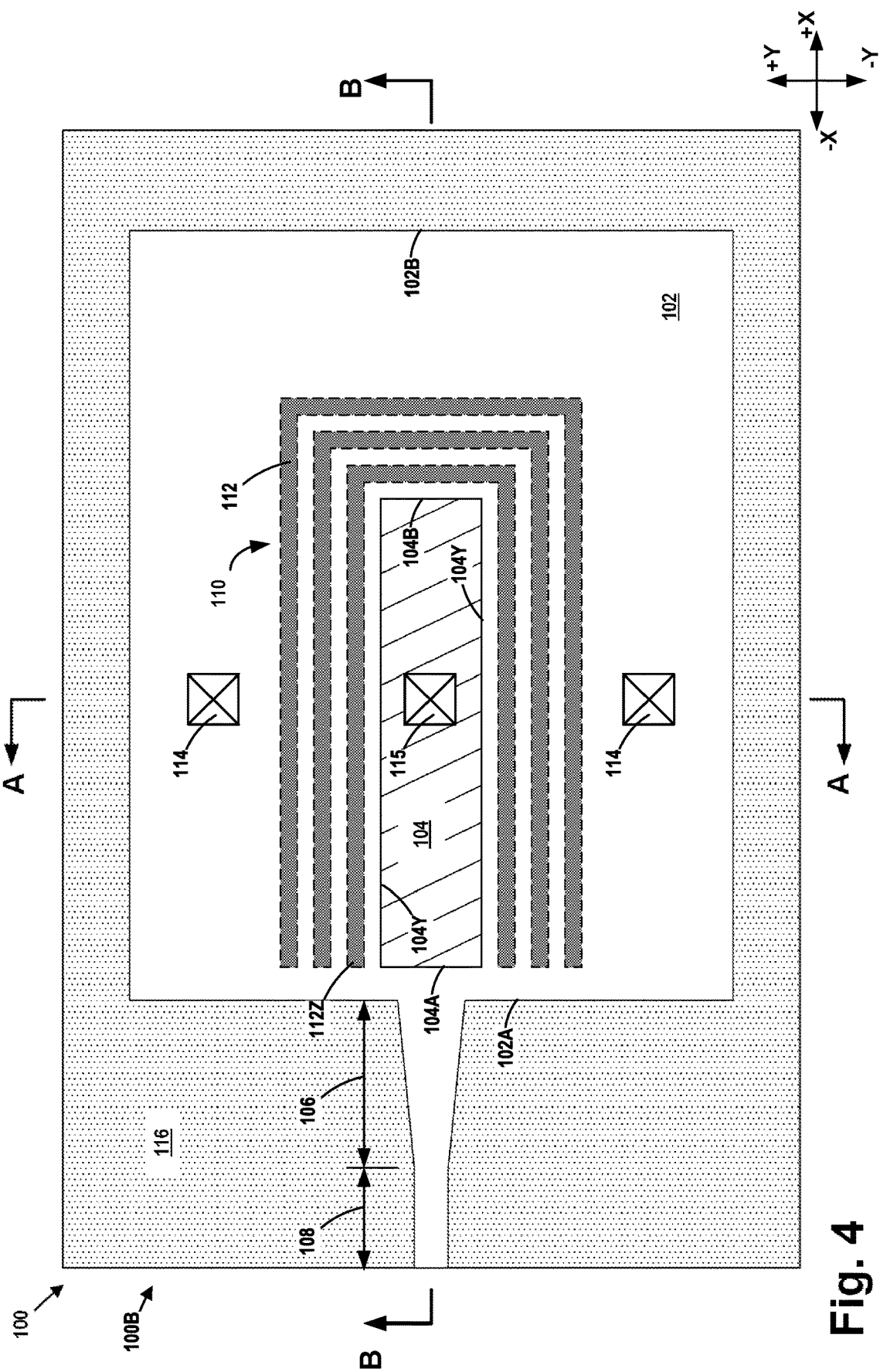
Figure 5:
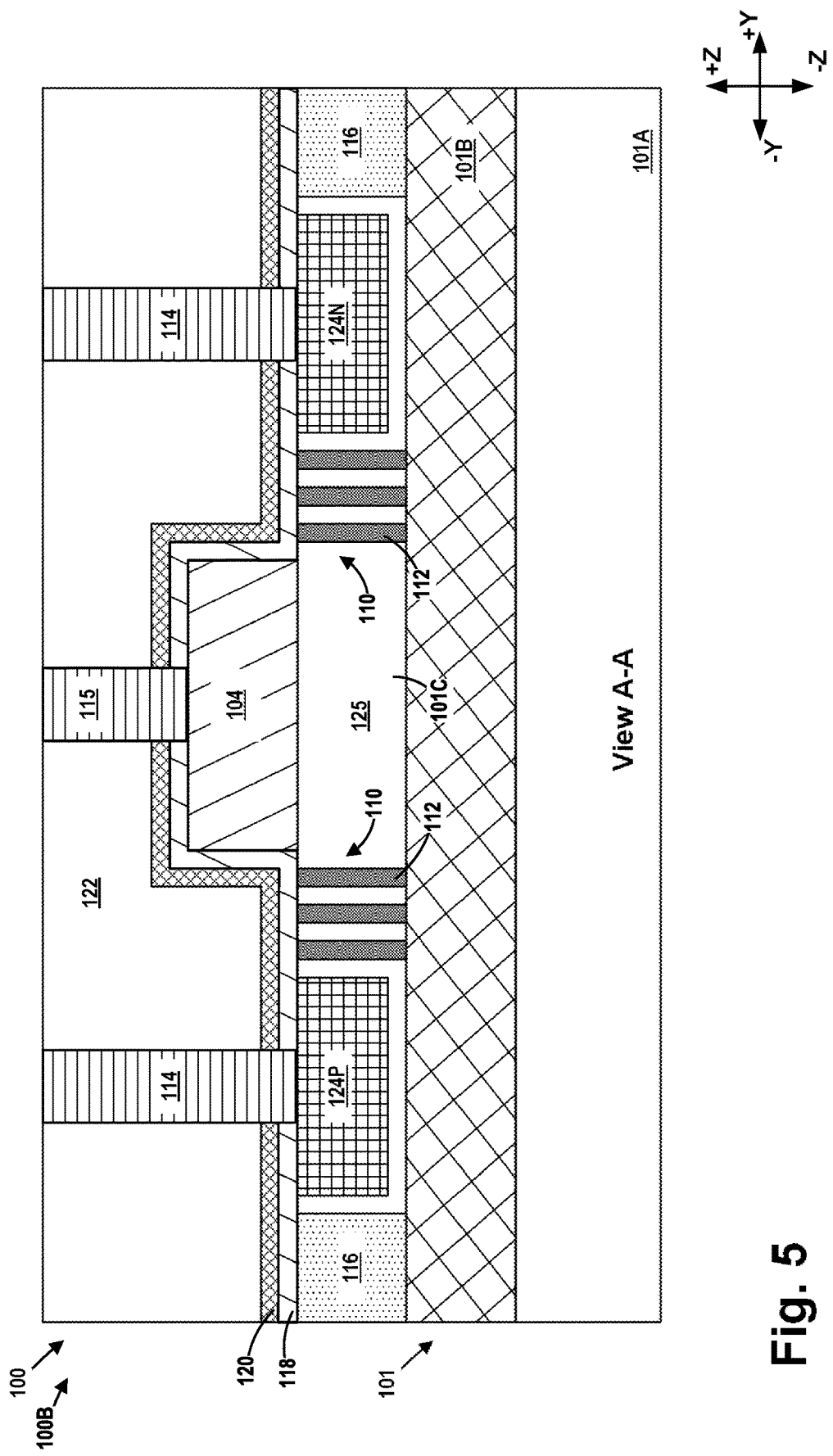
Figure 6:
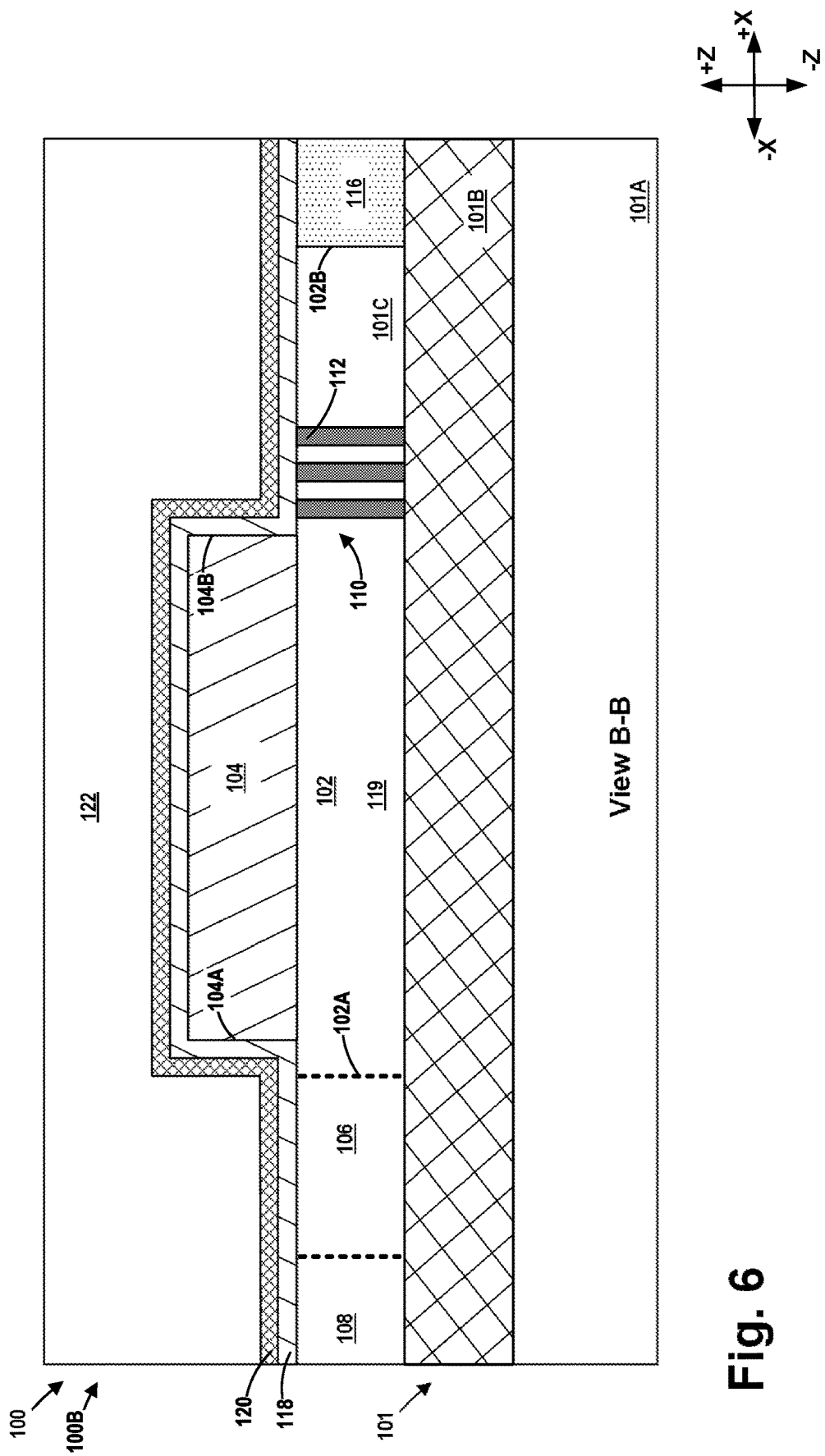

FIGS. 4-6 depict another illustrative embodiment of the photonic component 100 wherein the photonic component 100 is a photodetector 100B. Relative to the photodetector 100A (described above), and with reference to FIGS. 5 and 6, the dielectric elements 112 of the photodetector 100B extend throughout the entire vertical thickness of the active semiconductor layer 101C and contact the underlying buried insulation layer 101B. Additionally, in this embodiment, another conductive contact 115 was formed to contact the intrinsic absorption region 104. As before, the innermost surfaces of the innermost dielectric element 112Z of the Bragg reflector 110 define an area and at least a portion of the optical component 104 is positioned within a vertical projection of the area defined by the innermost surfaces of the innermost dielectric element 112Z. As was the case with the photodetector 100A, in the photodetector 100B, each of the dielectric elements 112 comprise a plurality of substantially linear segments that intersect one another.

Figure 7:
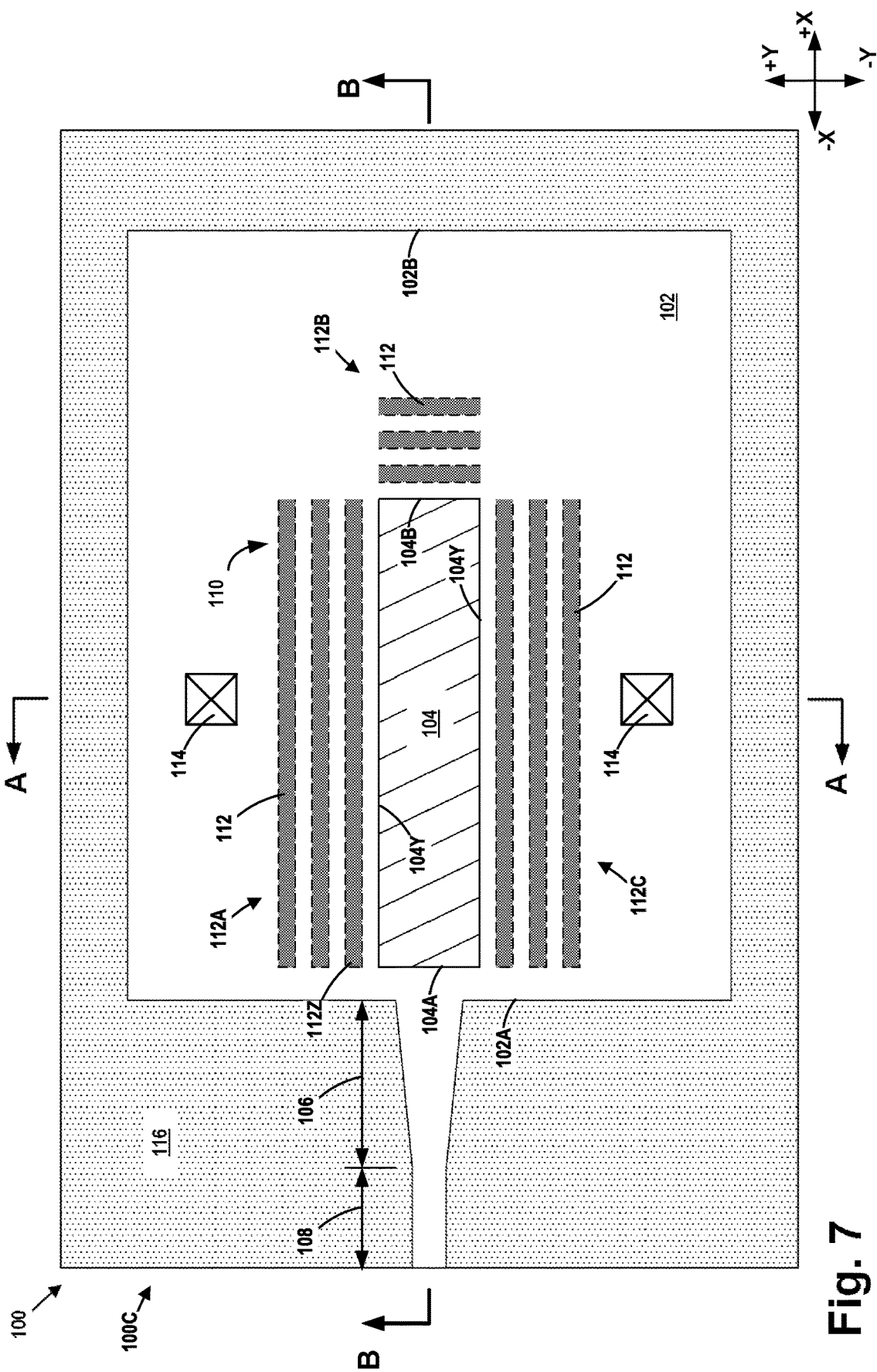
Figure 8:
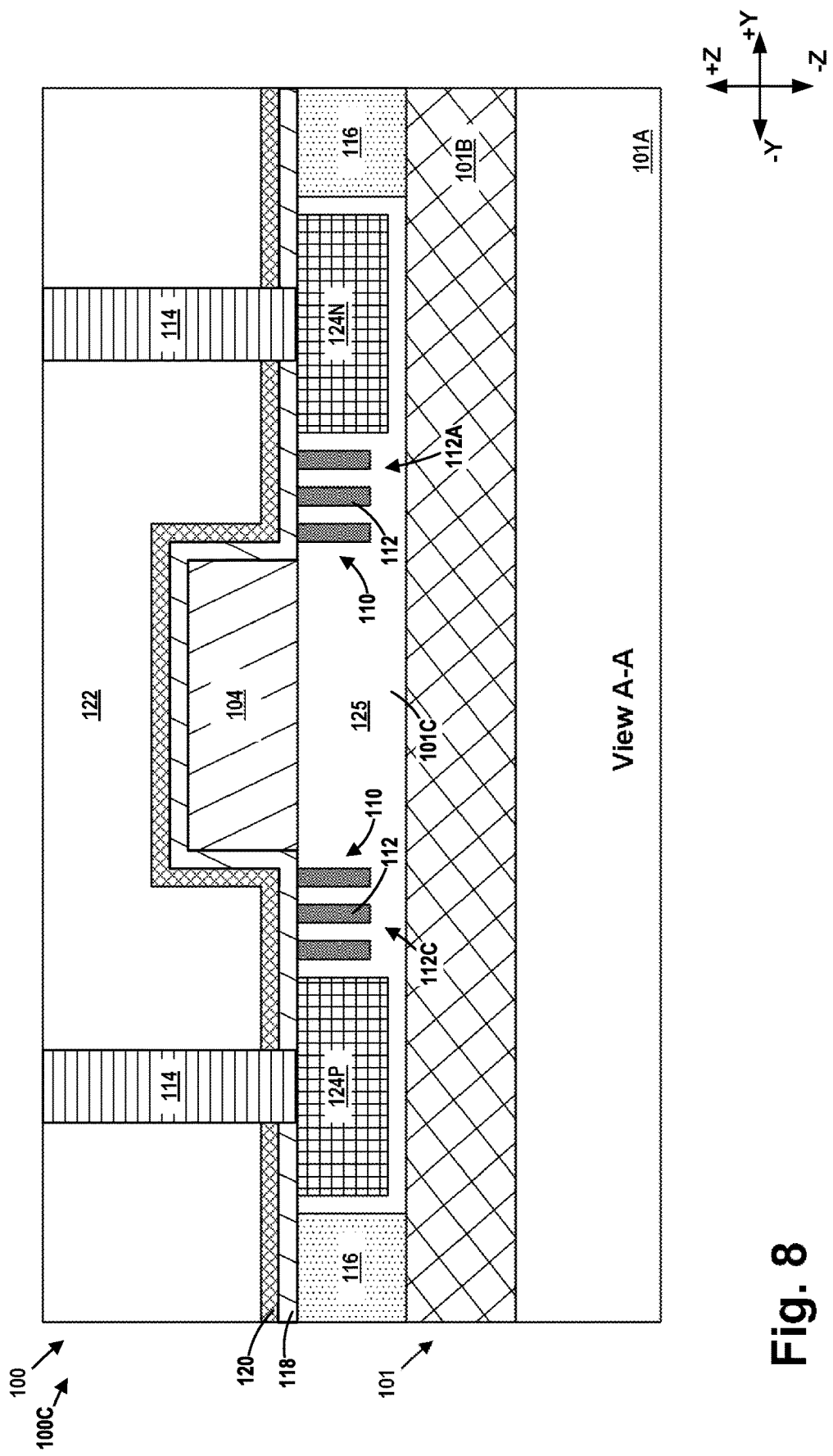
Figure 9:
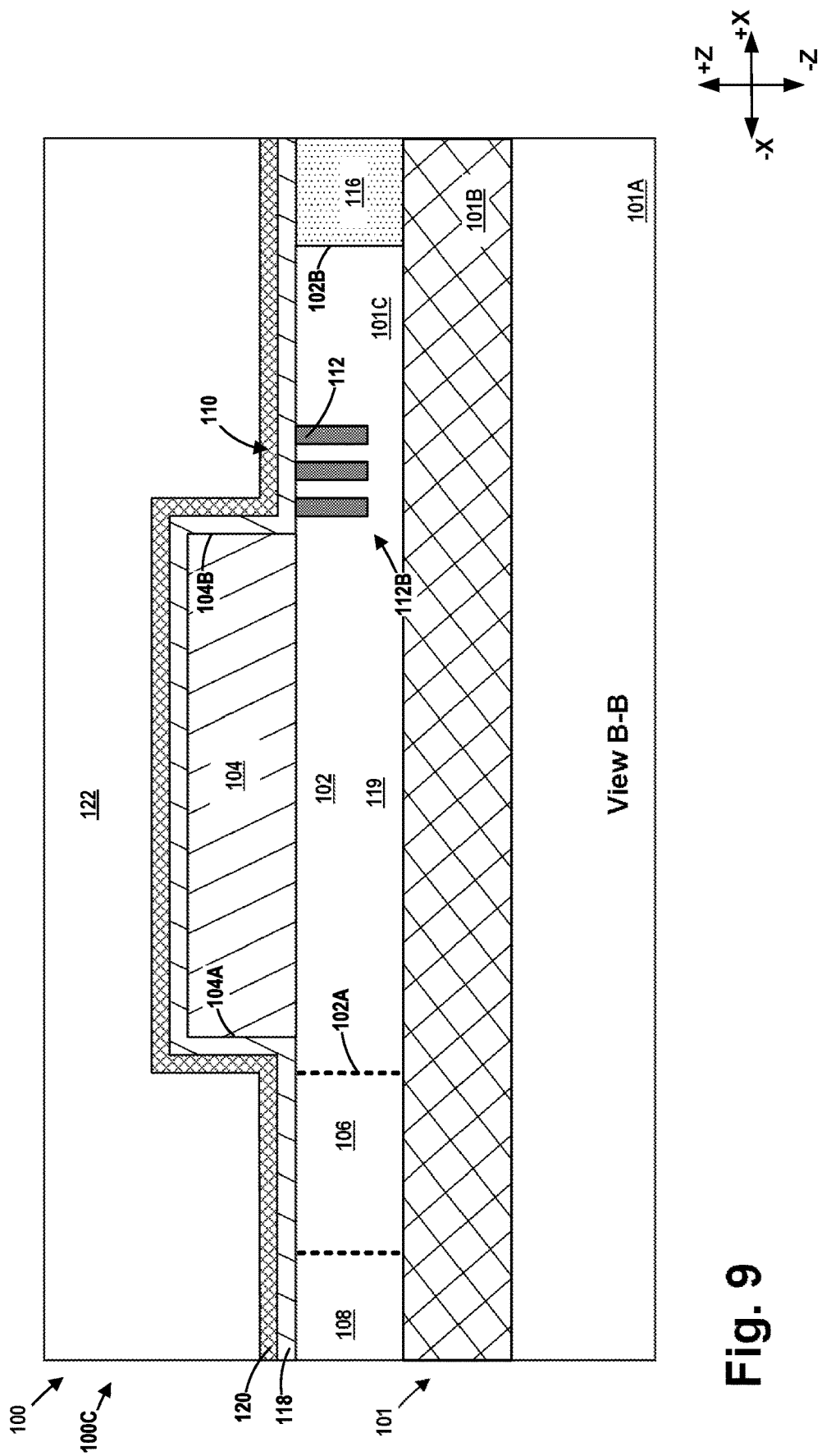

FIGS. 7-9 depict another illustrative embodiment of the photonic component 100 wherein the photonic component 100 is a photodetector 100C. Relative to the photodetector 100A (described above), the dielectric elements 112 of the photodetector 100C are not continuous. That is, a first group 112A of the dielectric elements 112 is positioned adjacent a downward projection of one of the side surfaces 104Y of the intrinsic absorption region 104, a second group 112B of the dielectric elements 112 is positioned adjacent a downward projection of the back surface 104B of the intrinsic absorption region 104 and a third group 112C of the dielectric elements 112 is positioned adjacent a downward projection of another side surface 104Y of the intrinsic absorption region 104. As depicted, the segments 112A-C are not connected to one another. Even though the dielectric elements 112 shown for the photodetector 100C are not continuous, i.e., not connected, the innermost surfaces of the innermost dielectric element 112Z of the Bragg reflector 110 define an area and at least a portion of the optical component 104 is positioned within a vertical projection of the area defined by the innermost surfaces of the innermost dielectric element 112Z. As depicted, each of the dielectric elements 112 comprise a plurality of substantially linear segments that do not intersect one another.

Figure 10:
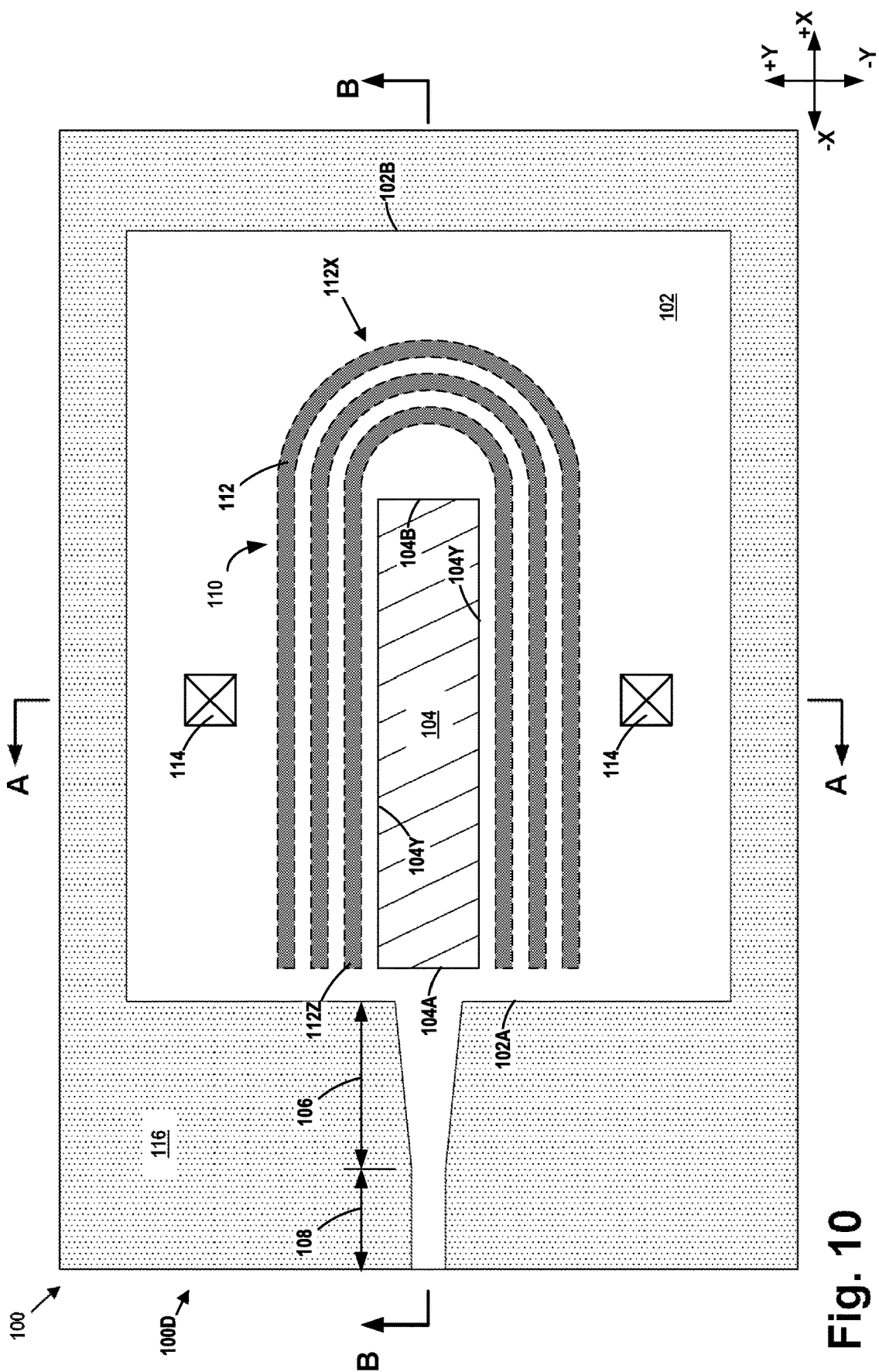
Figure 11:
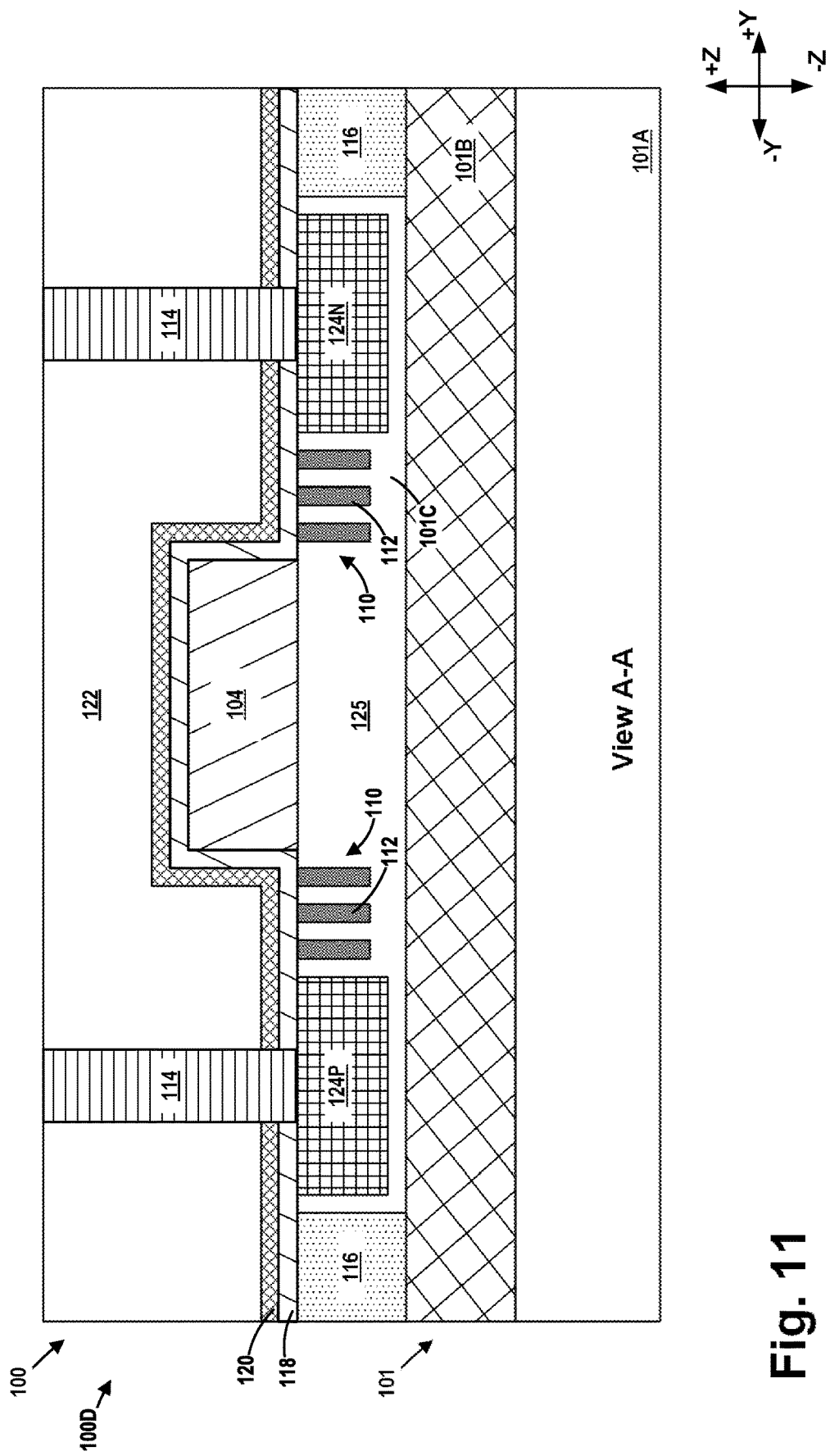
Figure 12:
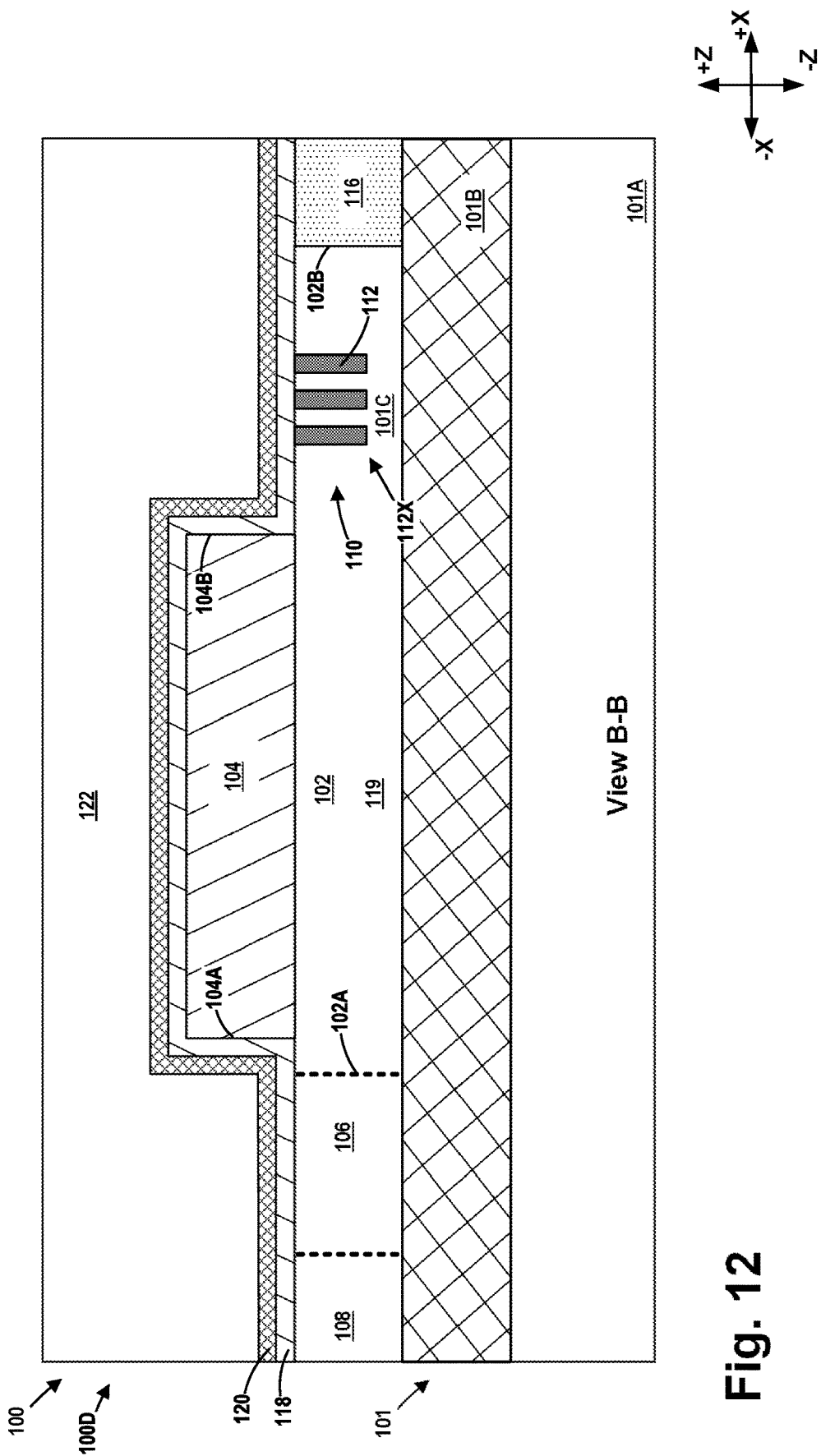

FIGS. 10-12 depict another illustrative embodiment of the photonic component 100 wherein the photonic component 100 is a photodetector 100D. Relative to the photodetector 100A (described above), the dielectric elements 112 of the photodetector 100D have an arcuate or non-linear portion 112X at a location that is adjacent a downward projection of the back surface 104B of the absorber. The dielectric elements 112 of the photodetector 100D also have a generally U-shaped configuration. The non-linear portion 112X of the dielectric elements 112 connects the substantially linear portions of the dielectric elements 112 that are positioned adjacent a downward projection of the side surfaces 104Y of the intrinsic absorption region 104. In the embodiment where the non-linear portion 112X of the dielectric elements 112 is arcuate, the degree of curvature may vary depending upon the particular application. As before, the innermost surfaces of the innermost dielectric element 112Z of the Bragg reflector 110 define an area and at least a portion of the optical component 104 is positioned within a vertical projection of the area defined by the innermost surfaces of the innermost dielectric element 112Z.

Figure 13:
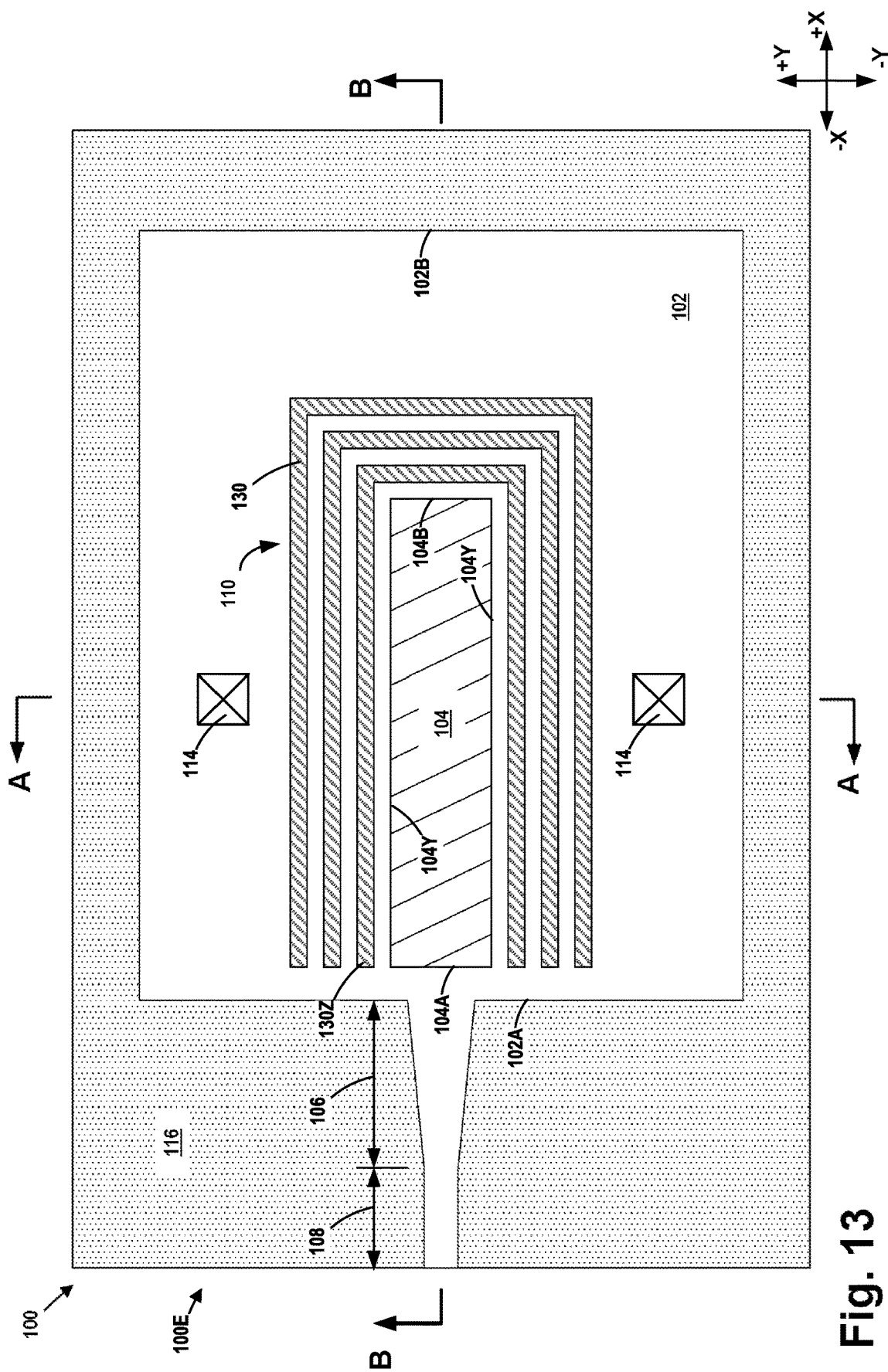
Figure 14:
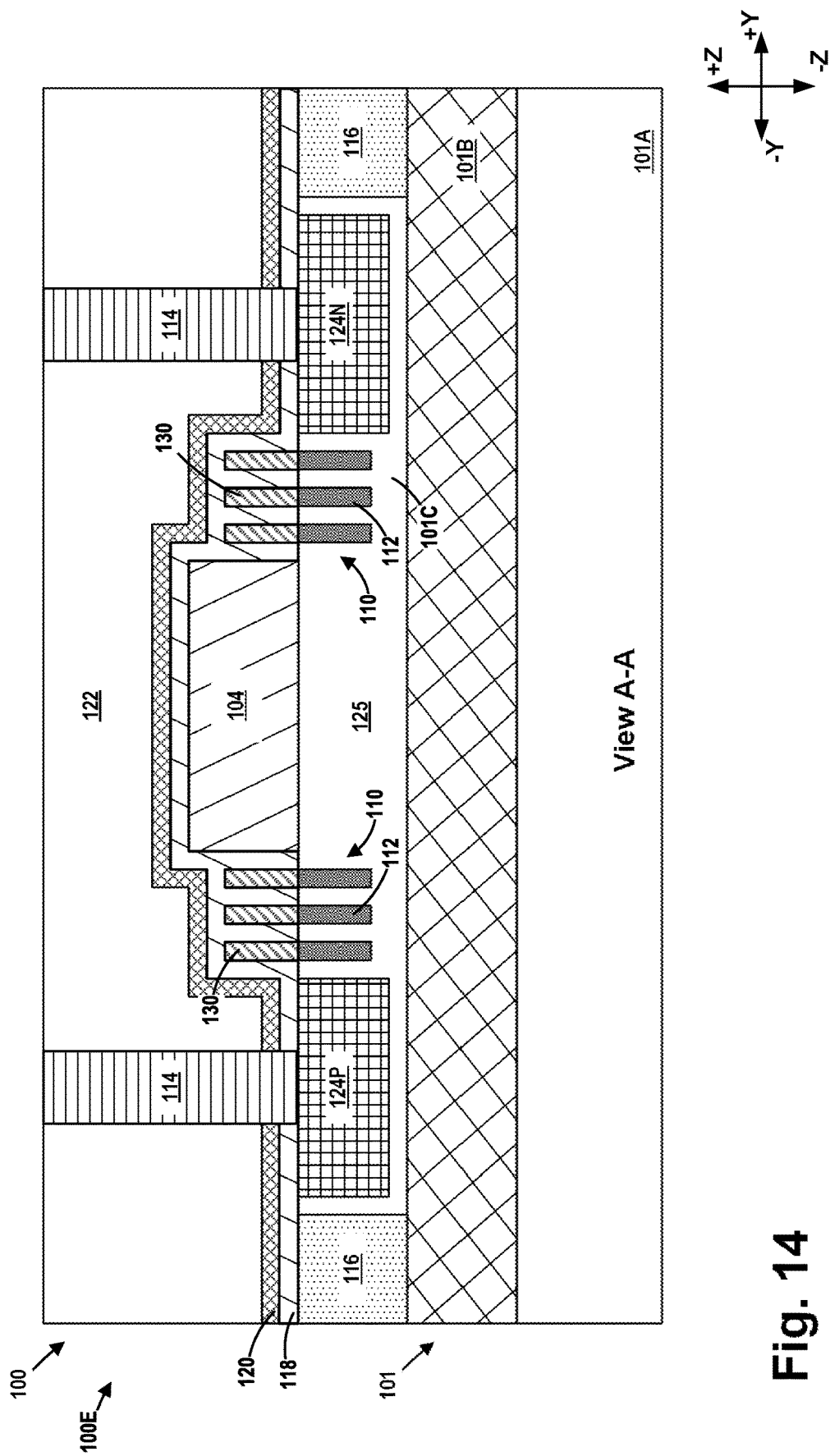
Figure 15:
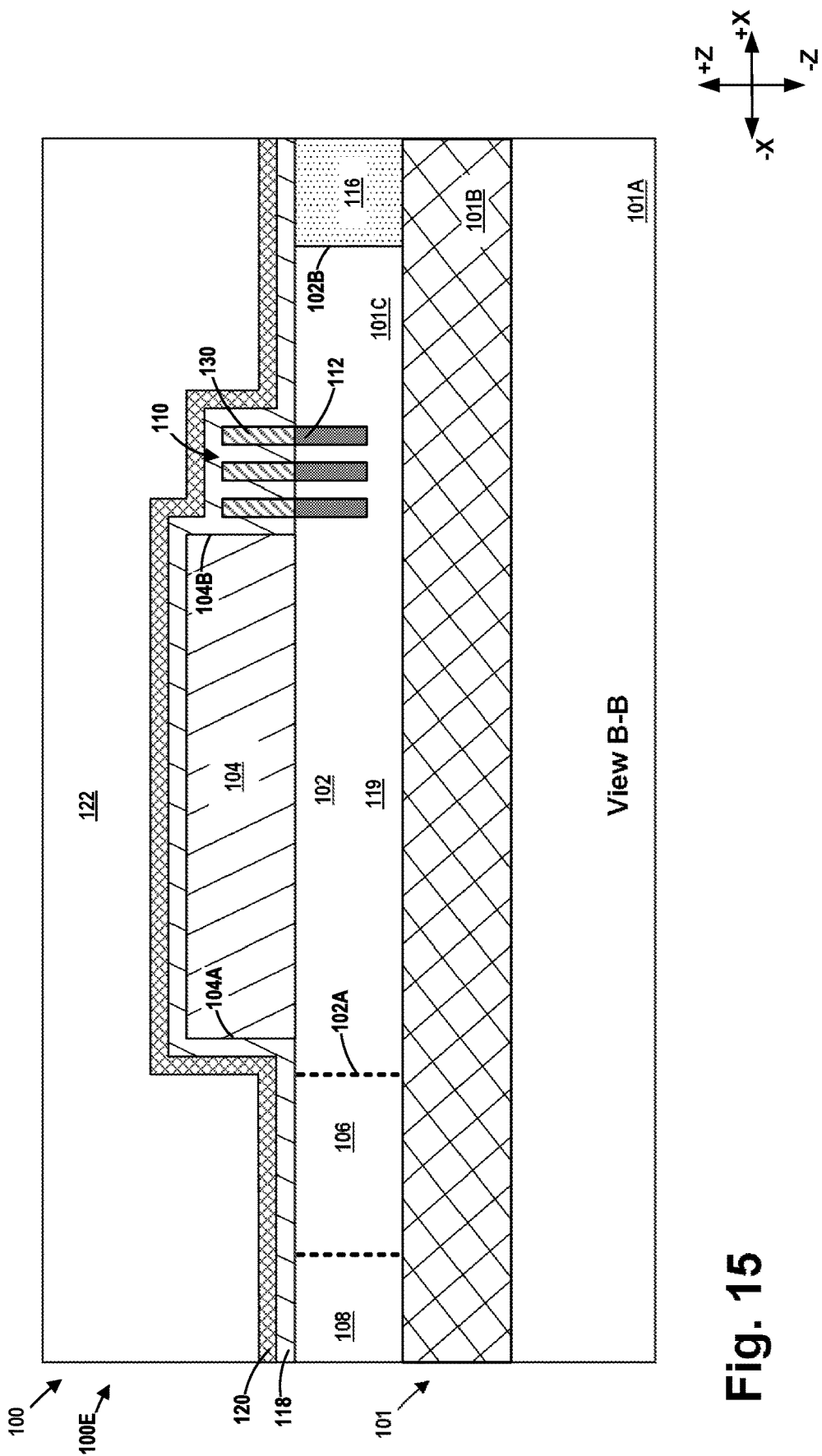

FIGS. 13-15 depict another illustrative embodiment of the photonic component 100 wherein the photonic component 100 is a photodetector 100E. Relative to the photodetector 100A (described above), the Bragg reflector 110 of the photodetector 100E comprises a plurality of additional upper elements 130 that are formed above the active semiconductor layer 101C of the substrate 101 and around at least a portion of an outer perimeter (when viewed from above) of the intrinsic absorption region 104. In this particular example, the upper elements 130 are substantially a mirror image of the dielectric elements 112 formed in the active semiconductor layer 101C. However, the number, position, size and arrangement of the upper elements 130 and the dielectric elements 112 need not be the same, but that may be the case in some applications. For example, the number and/or spacing of the upper elements 130 and the dielectric elements 112 may be different from one another. The physical dimensions of the upper elements 130 and the spacing between adjacent upper elements 130 may vary depending upon the particular application. Moreover, the physical dimensions of all of the upper elements 130 in the Bragg reflector 110 and the spacing between adjacent upper elements 130 need not be uniform, but that may be the case in some applications. In some applications, the upper elements 130 may have dimensions similar to those noted above for the dielectric elements 112. The upper elements 130 may be made of a variety of materials, e.g., polysilicon, amorphous silicon, silicon nitride, aluminum nitride, etc., and they may be formed by performing a variety of known deposition, masking and etching processes that are well known to those skilled in the art. As before, the innermost surfaces of the innermost upper element 130Z of the Bragg reflector 110 define an area and at least a portion of the optical component 104 is positioned within a vertical projection of the area defined by the innermost surfaces of the innermost reflector element 130Z. As was the case with the photodetector 100A, in the photodetector 100E, each of the upper elements 130 comprise a plurality of substantially linear segments that intersect one another. In this embodiment, the plurality of dielectric elements 112 may be considered to be a part of the first Bragg reflector, while the plurality of upper elements 130 may be considered to be a part of a second Bragg reflector, or vice-versa.

Figure 16:
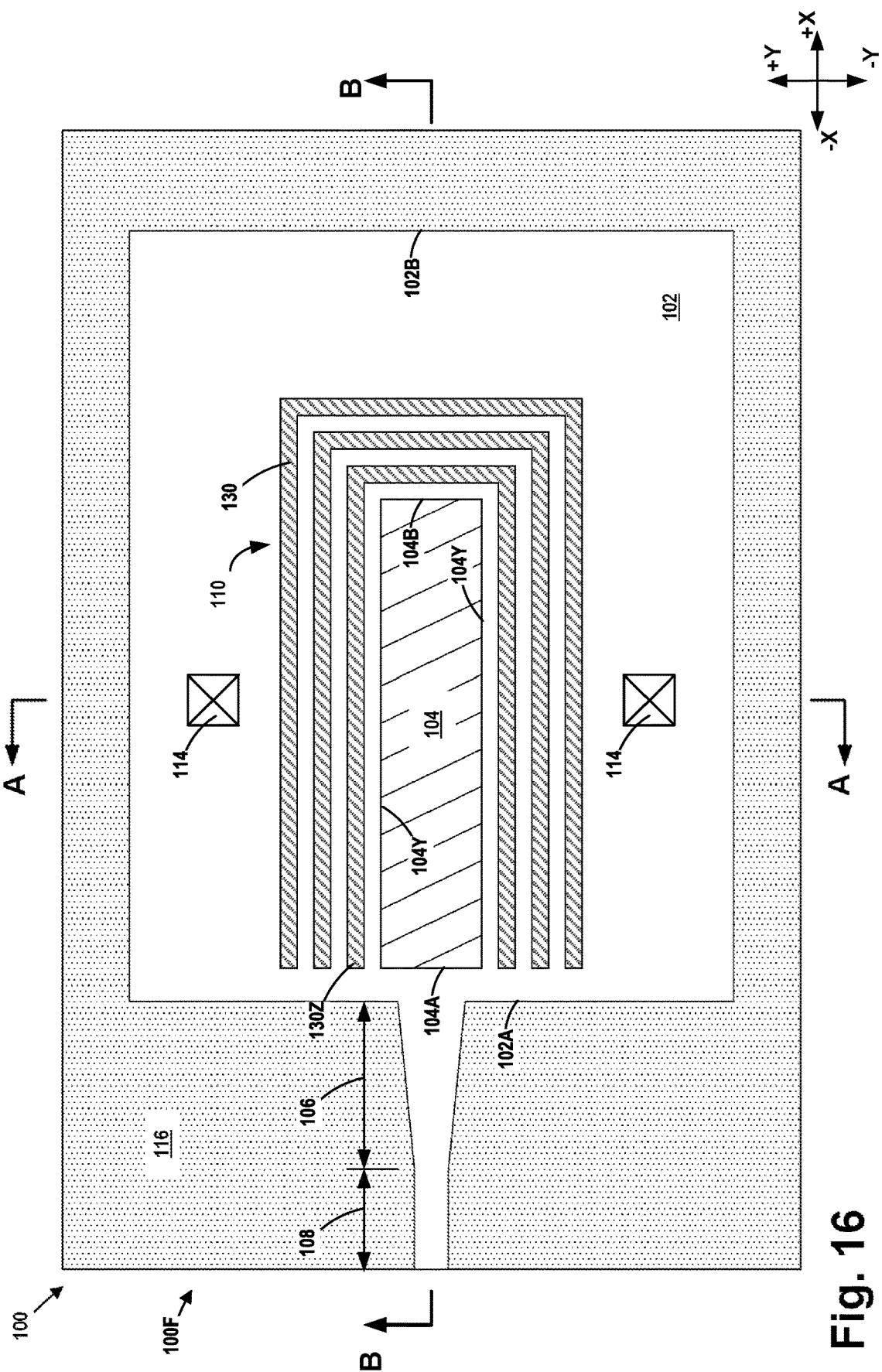
Figure 17:
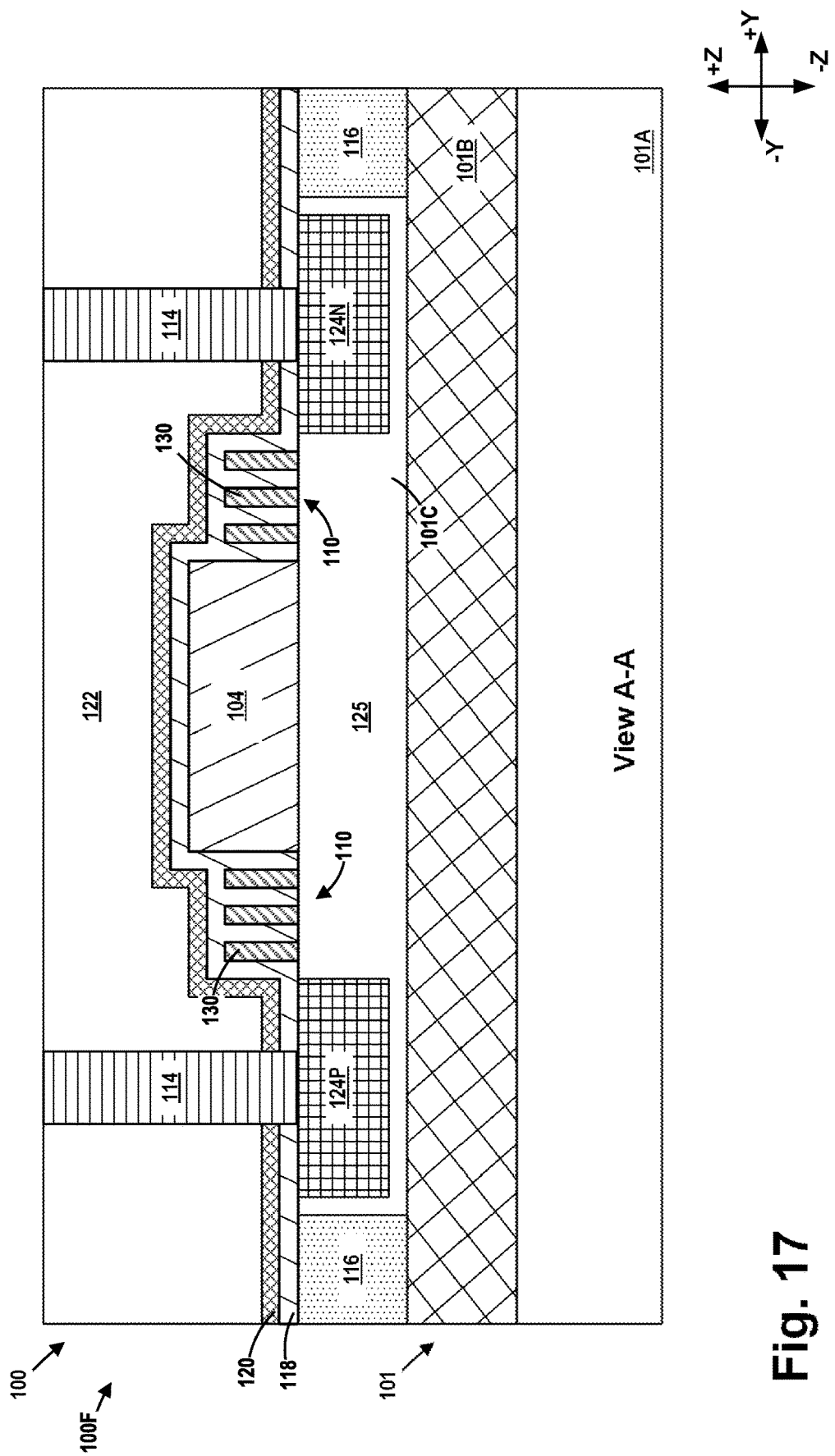
Figure 18:
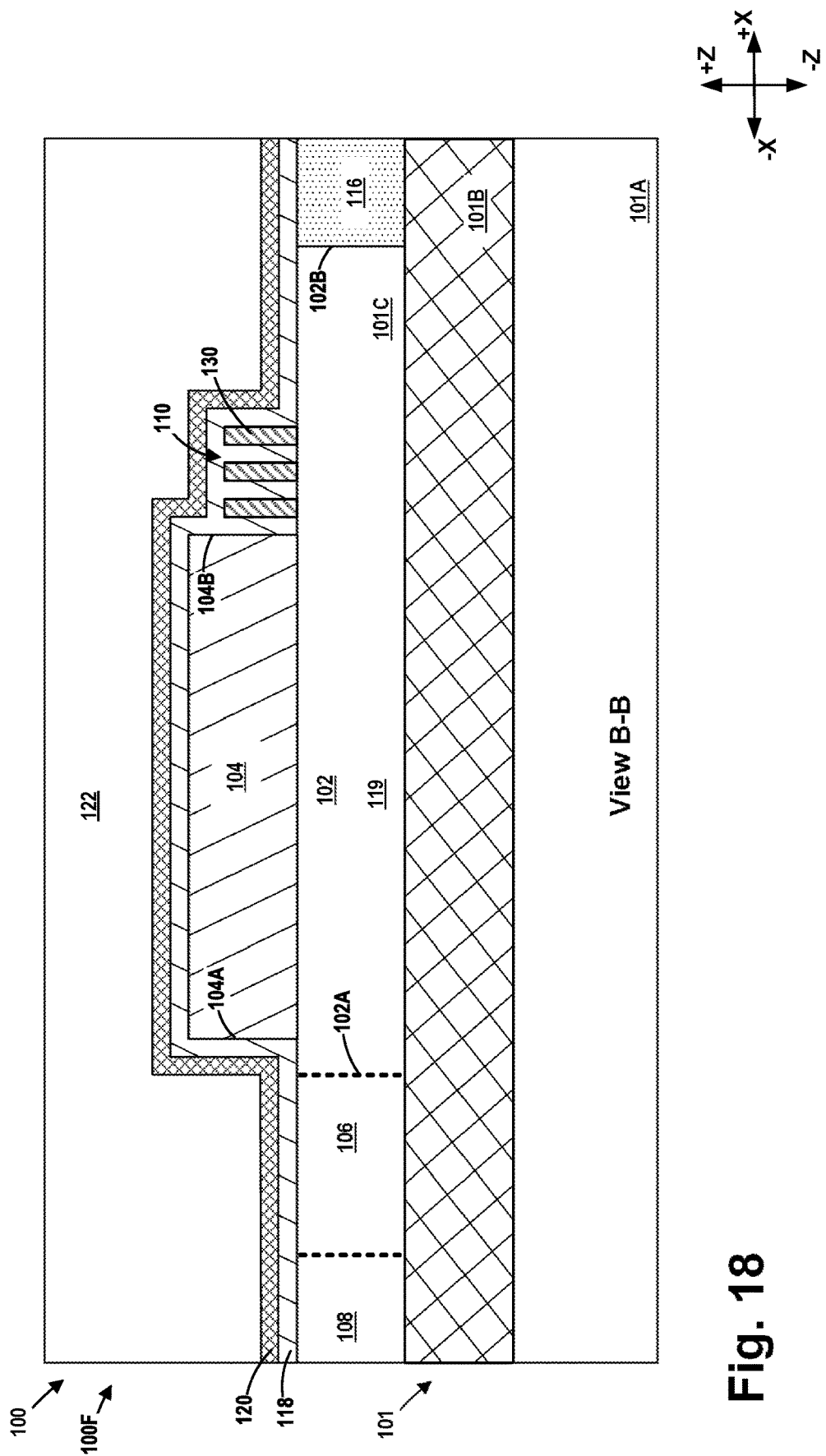

FIGS. 16-18 depict another illustrative embodiment of the photonic component 100 wherein the photonic component 100 is a photodetector 100F. Relative to the photodetector 100E (described immediately above), the Bragg reflector 110 of the photodetector 100F only comprises upper elements 130 that are formed above the active semiconductor layer 101C of the substrate 101. That is, relative to the photodetector 100E shown in FIGS. 13-15, the photodetector 100F does not have the dielectric elements 112 positioned in the active semiconductor layer 101C. As before, the innermost surfaces of the innermost reflector element 130Z of the Bragg reflector 110 define an area and at least a portion of the optical component 104 is positioned within a vertical projection of the area defined by the innermost surfaces of the innermost upper element 130Z. As was the case with the photodetector 100A, in the photodetector 100F, each of the plurality of upper elements 130 comprise a plurality of substantially linear segments that intersect one another.

Figure 19:
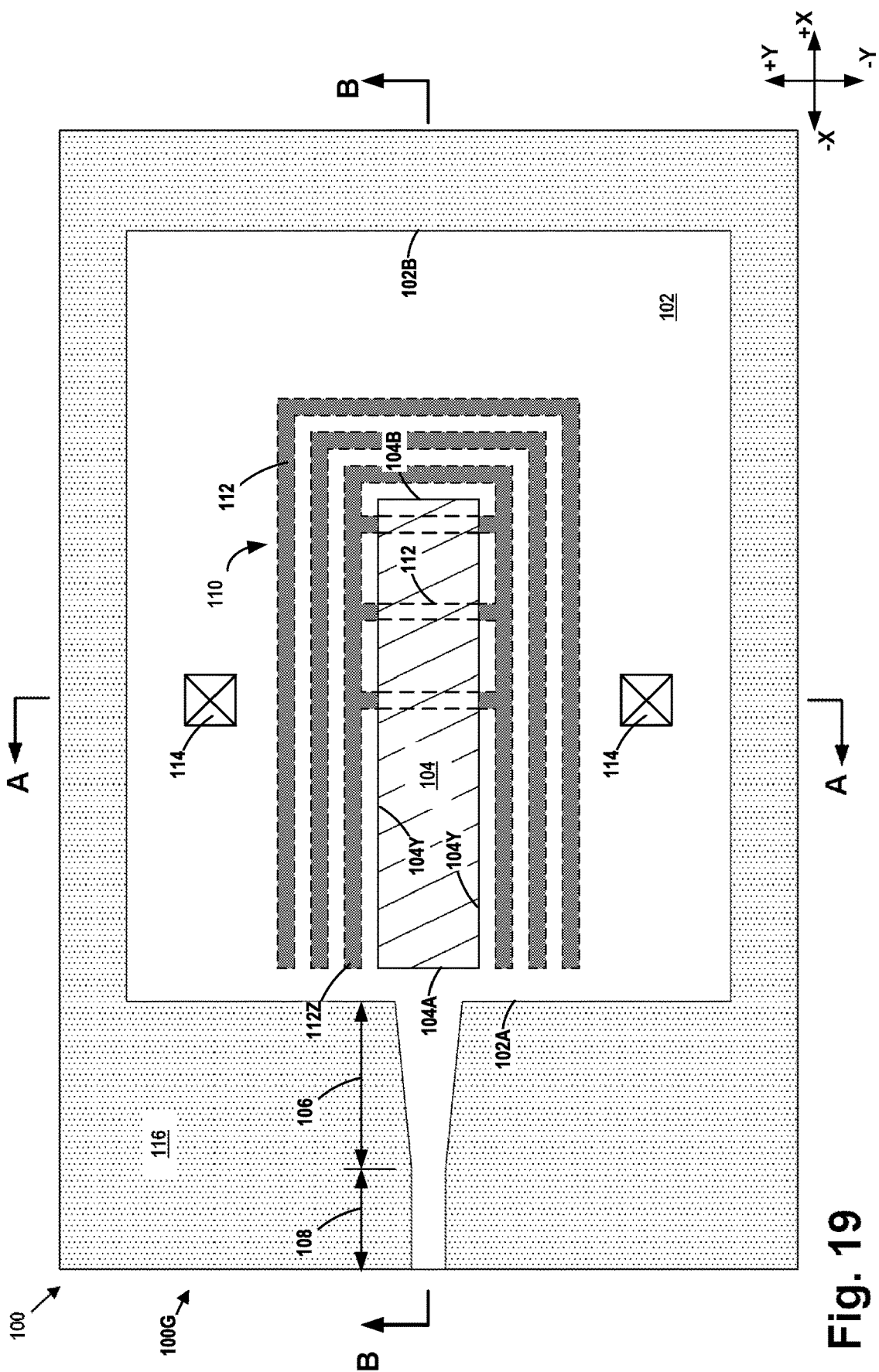
Figure 20:
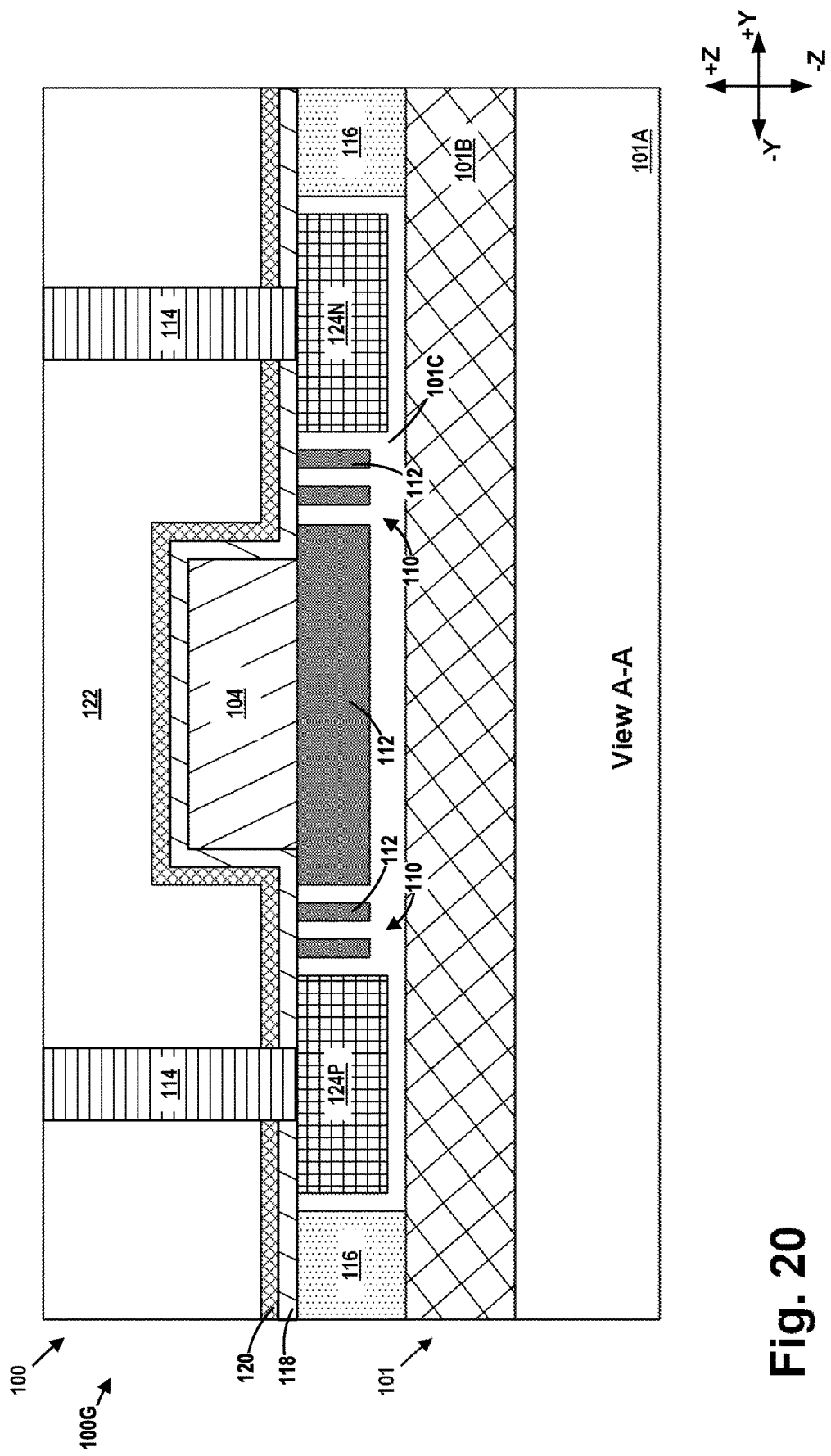
Figure 21:
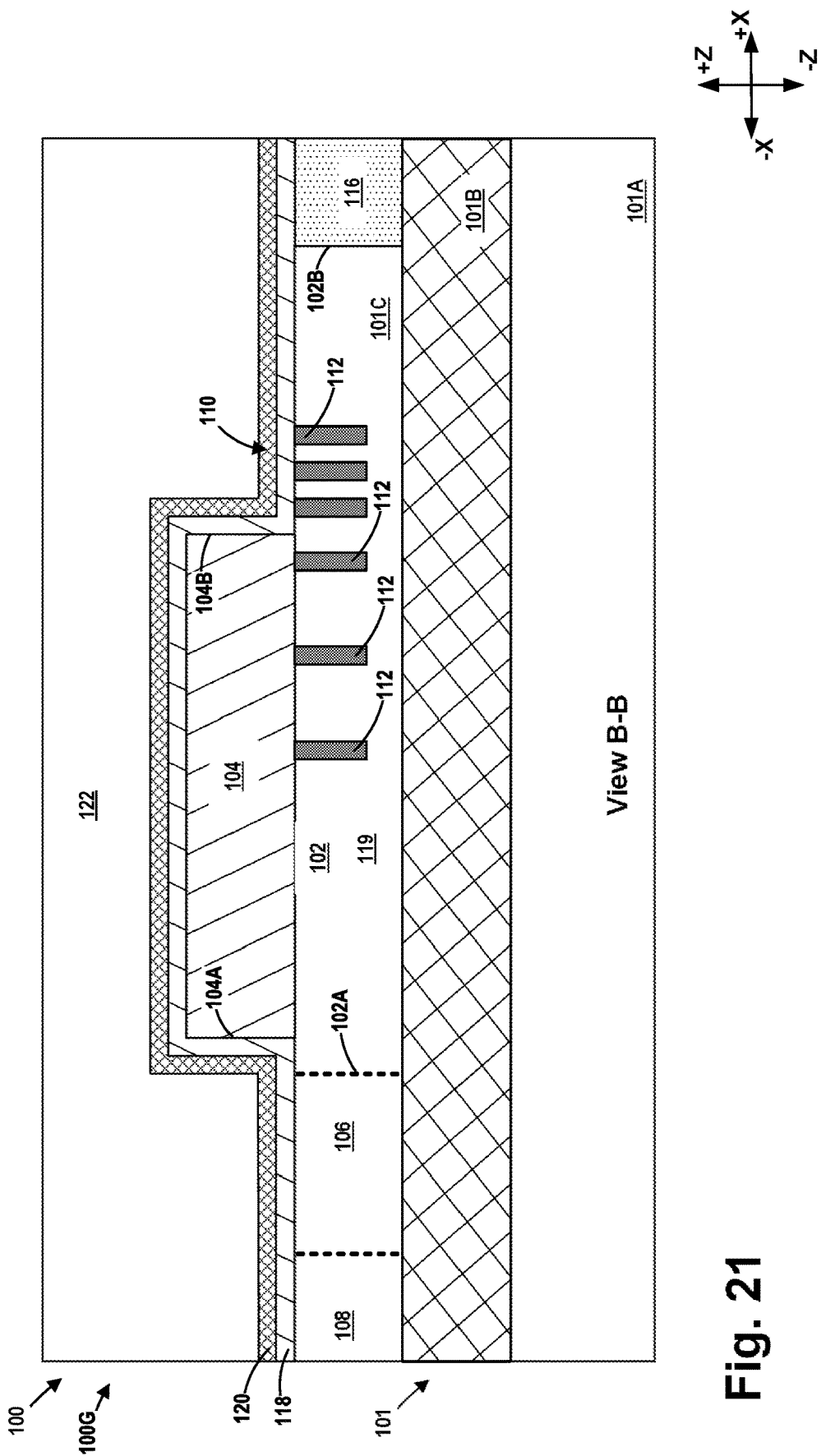

FIGS. 19-21 depict another illustrative embodiment of the photonic component 100 wherein the photonic component 100 is a photodetector 100G. Relative to the photodetector 100A (described above), one or more portions of the dielectric elements 112 of the photodetector 100G extend under a downward projection of the intrinsic absorption region 104. The number of the portions of the dielectric elements 112 as well as their relative spacing and size may vary depending upon the particular application. As before, not including the portions of the dielectric elements 112 that extend under the intrinsic absorption region 104, the innermost surfaces of the innermost dielectric element 112Z of the Bragg reflector 110 define an area and at least a portion of the optical component 104 is positioned within a vertical projection of the area defined by the innermost surfaces of the innermost dielectric element 112Z. As was the case with the photodetector 100A, in the photodetector 100G, each of the dielectric elements 112 comprise a plurality of substantially linear segments that intersect one another.

As will be appreciated by those skilled in the art after a complete reading of the present application, the various embodiments of the distributed Bragg reflector 110 disclosed herein may be used with a variety of different optical components 100, including both active components, e.g., photodetectors, Fabry-Perot laser cavities, etc., and passive components, e.g., grating couplers, etc.

Figure 22:
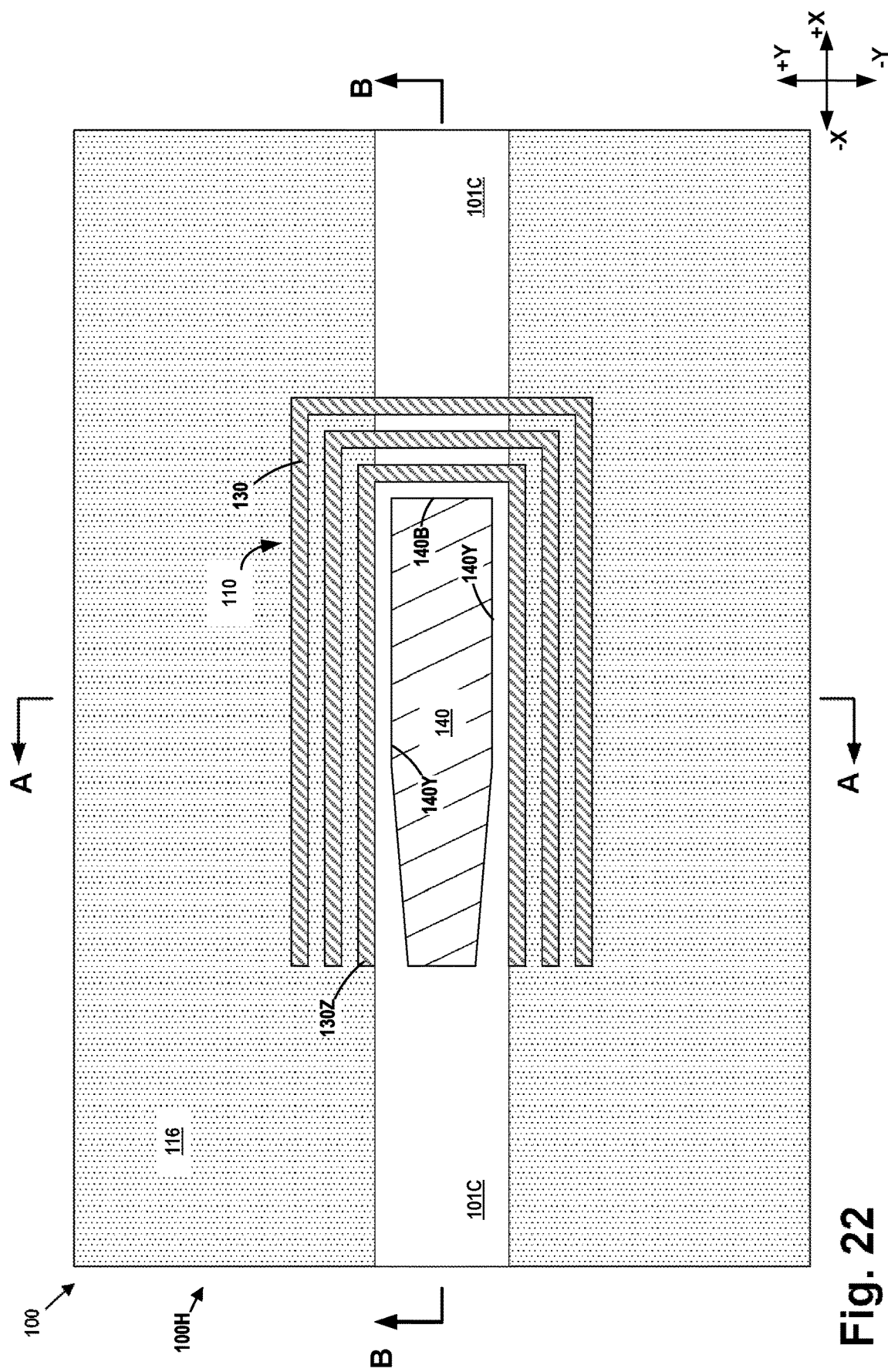
Figure 23:
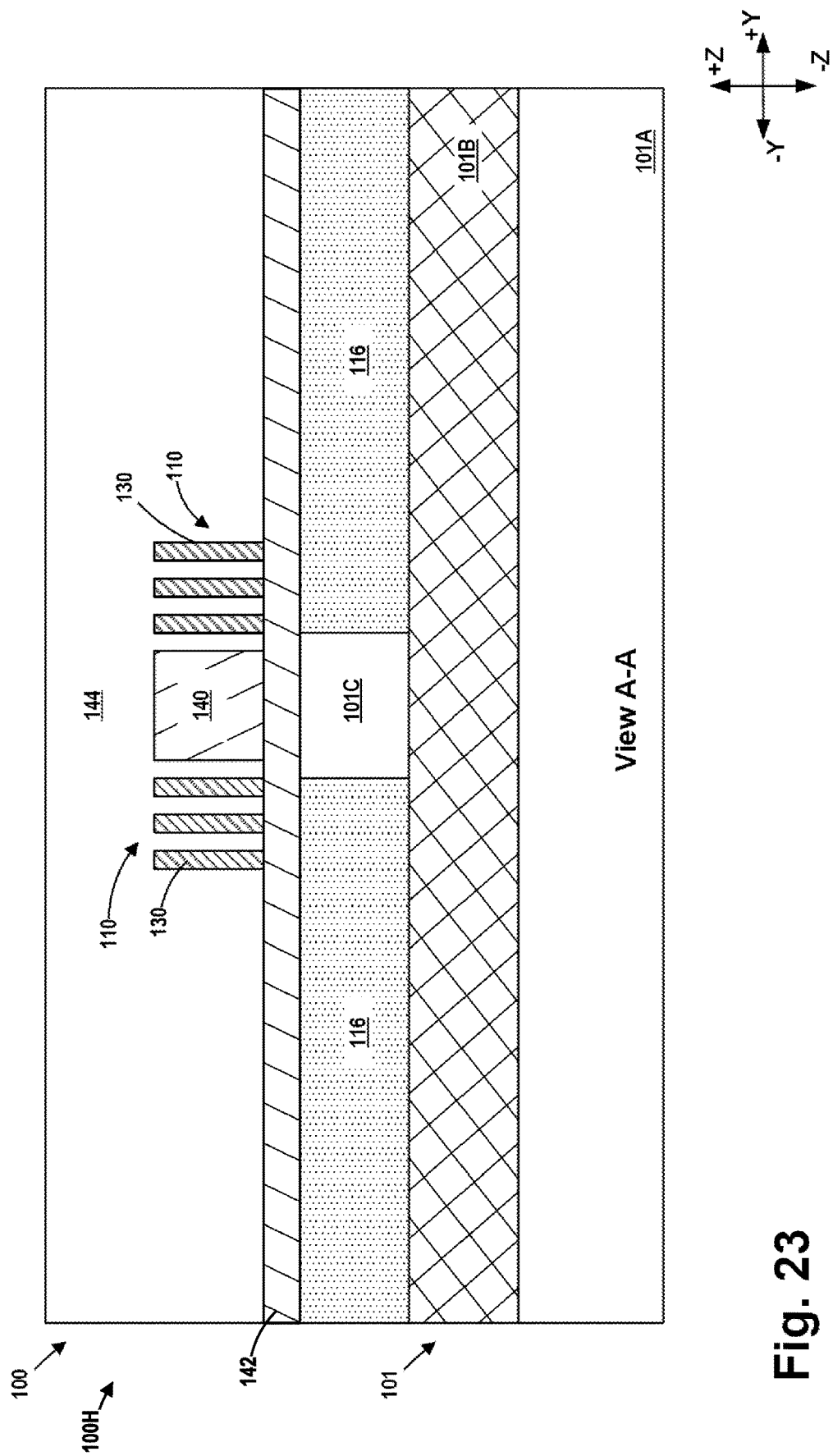
Figure 24:
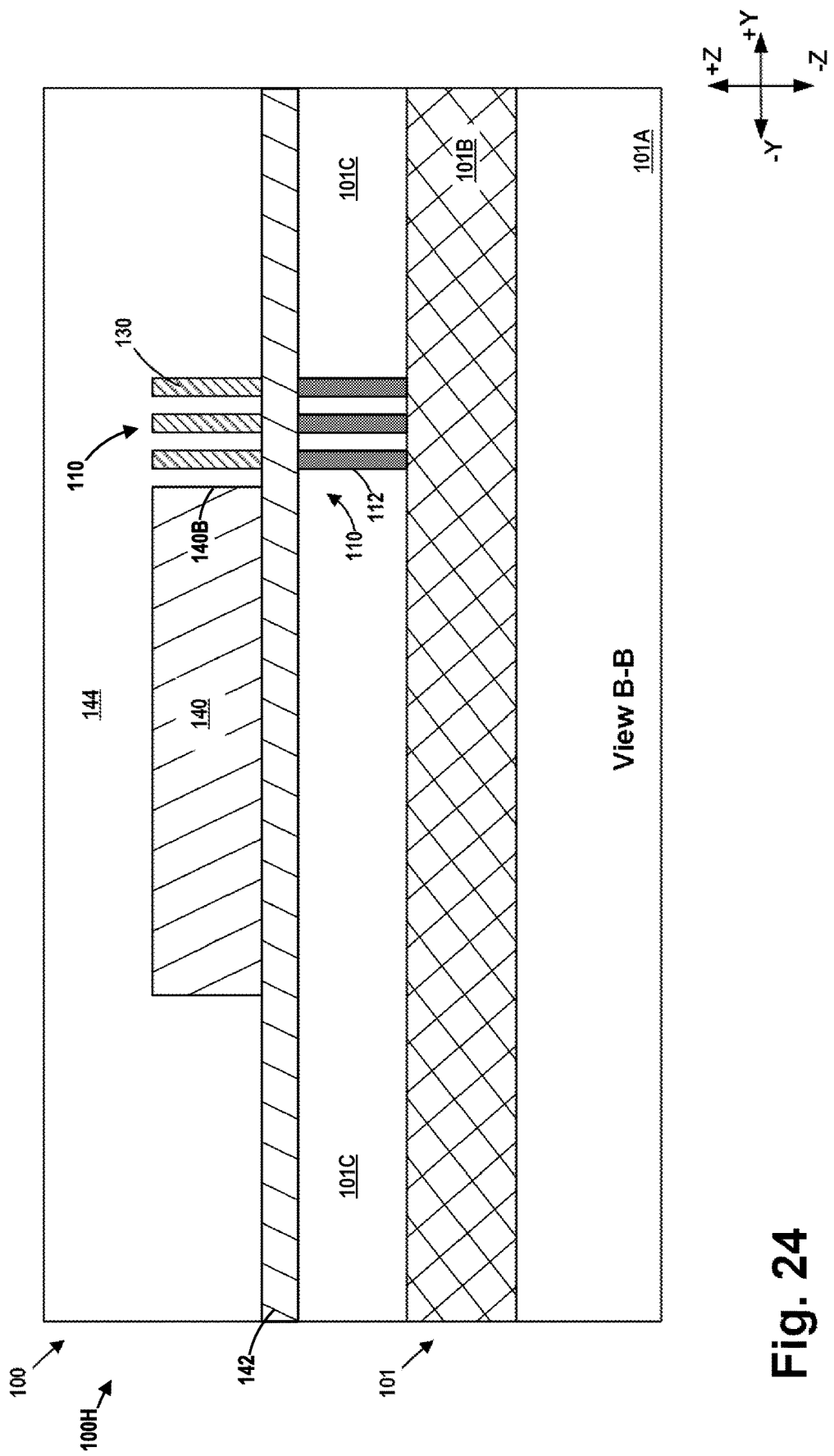

FIGS. 22-24 depict another embodiment of the optical component 100 wherein the optical component 100 is a coupler 100H, e.g., a silicon to silicon nitride coupler. The coupler 100H comprises an upper body 140 that is positioned above a lower body—a portion of the active semiconductor layer 101C. The upper body 140 may be of any size, shape or configuration and it may be comprised of a variety of different materials, e.g., silicon nitride, aluminum nitride, a semiconductor material, etc. In this illustrative example, the distributed Bragg reflector 110 of the coupler 100H comprises a plurality of the above-described upper elements 130 (see FIG. 16) positioned around at least a portion of the side surfaces 140Y and at least a portion of the back surface 140B of the upper body 140, i.e., around at least a portion of the outer perimeter (when viewed from above) of the upper body 140. With reference to FIG. 24, the coupler 100H also includes a plurality of the dielectric elements 112 positioned in the active semiconductor layer 101C at a location adjacent the downward projection of the back surface 140Y of the upper body 140. Also depicted in FIGS. 23-24 are a layer of insulating material 142 and a representative layer of one or more layers of insulating material 144 (similar to that described above for the layer 122). As before, the innermost surfaces of the innermost upper element 130Z of the Bragg reflector 110 define an area and at least a portion of the optical component 104 is positioned within a vertical projection of the area defined by the innermost surfaces of the innermost upper element 130Z. As was the case with the photodetector 100A, in the photodetector 100H, each of the plurality of upper elements 130 comprise a plurality of substantially linear segments that intersect one another.

As will be appreciated by those skilled in the art after a complete reading of the present application, the various embodiments of the distributed Bragg reflector 110, the dielectric elements 112 and the upper elements 130 may be mixed and matched in any desired fashion for any particular application. For example, the upper elements 130 shown in FIG. 16 could have the same curved or radiused configuration 112X as the dielectric elements 112 shown in FIG. 10 or they could be non-continuous elements like the dielectric elements 112 shown in FIG. 7. Thus, the subject matter disclosed herein should not be considered to be limited to the illustrative examples depicted herein as those skilled in the art, after reading the present application, will appreciate that there are many possible combinations and configurations of the various embodiments of the novel distributed Bragg reflectors 110 disclosed herein.

As will be appreciated by those skilled in the art after a complete reading of the present application, the various embodiments of the distributed Bragg reflector 110 disclosed herein may provide several benefits to various forms of the optical components 100. For example, in the case where the optical component 100 is a photodetector, not all of the incident light that strikes the intrinsic absorption region 104 of the photodetector will be redirected to the active layer 102 (where at least some portion of this redirected light will be converted to photocurrent). The presence of the various embodiments of the distributed Bragg reflector 110 disclosed herein effectively reflects some of the light that would otherwise pass through the intrinsic absorption region 104 back to the intrinsic absorption region 104 where it is redirected to the active layer 102 for conversion to photocurrent.

The presence of the various embodiments of the distributed Bragg reflector 110 disclosed herein may also have a positive impact on reducing the area occupied by (or "footprint" of) the various forms of the optical components 100, thereby leading to improved scaling. For example, in the case where the optical component 100 is a photodetector, the axial length 104L of the intrinsic absorption region 104 and the active layer 102 may be reduced. One of the characteristics of a photodetector is known as its responsivity—a measurement of the electrical output of the photodetector as compared to optical input to the photodetector. The higher the responsivity of the photodetector the better. By use of the various embodiments of the distributed Bragg reflector 110 disclosed herein, the axial length 104L of the intrinsic absorption region 104 may be reduced, thereby increasing the responsivity of the photodetector.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
a layer of semiconductor material;
a first Bragg reflector structure positioned in the layer of semiconductor material, the first Bragg reflector structure comprising a plurality of dielectric elements and a first internal area defined by an innermost of the first plurality of dielectric elements; and
an optical component positioned above the layer of semiconductor material, wherein at least a portion of the optical component is positioned within a vertical projection of the first internal area,
wherein the optical component includes a front surface, a back surface, a first side surface and a second side surface, and
wherein the plurality of dielectric elements include a first linear segment positioned adjacent the first side surface, a second linear segment positioned adjacent the second side surface and a third segment positioned adjacent the back surface.

2. The device of claim 1, wherein, when viewed from above, the optical component has an outer perimeter and a second area, wherein the first internal area is greater than the second area and wherein the entirety of the outer perimeter of the optical component is positioned within the vertical projection of the first internal area.

3. The device of claim 1, wherein the optical component is a portion of one of a photodetector, a coupler or a Fabry-Perot laser cavity.

4. The device of claim 1, wherein the semiconductor material is an active semiconductor layer of a semiconductor-on-insulator (SOI) substrate.

5. The device of claim 4, wherein the optical component is an intrinsic absorption region of a photodetector, and wherein the photodetector further comprises an active layer positioned under the intrinsic absorption region, the active layer comprising part of the active semiconductor layer of the SOI substrate.

6. The device of claim 4, wherein the optical component is an upper body of a coupler, and wherein the coupler further comprises a lower body positioned under the upper body, the lower body comprising part of the active semiconductor layer of the SOI substrate.

7. The device of claim 4, wherein each of the plurality of dielectric elements have a vertical thickness that is less than a vertical thickness of the active semiconductor layer of the SOI substrate.

8. The device of claim 4, wherein each of the plurality of dielectric elements extend from an upper surface of the active semiconductor layer of the SOI substrate to an upper surface of a buried insulation layer of the SOI substrate.

9. The device of claim 1, wherein each of the plurality of dielectric elements are continuous structures.

10. The device of claim 1, wherein, when viewed from above, each of the plurality of dielectric elements have a U-shaped configuration.

11. The device of claim 1, wherein the plurality of dielectric elements comprises an insulating material, silicon dioxide, silicon nitride, aluminum oxide, magnesium oxide or a material having a refractive index less than 1.6.

12. The device of claim 1, wherein the third segment is a linear segment that intersects the first linear segment and the second linear segment.

13. The device of claim 1, wherein each of the plurality of dielectric elements is non-continuous.

14. The device of claim 1, wherein the third segment is not connected to the first segment or the second segments.

15. The device of claim 1, further comprising a second plurality of dielectric elements positioned below the optical component and within the first internal area.

16. A device, comprising:
a layer of semiconductor material;
a first Bragg reflector structure positioned in the layer of semiconductor material, the first Bragg reflector structure comprising a plurality of dielectric elements and a first internal area defined by an innermost of the first plurality of dielectric elements; and
an optical component positioned above the layer of semiconductor material, wherein at least a portion of the optical component is positioned within a vertical projection of the first internal area,
wherein the optical component comprises a front surface, a back surface, a first side surface and a second side surface and wherein the plurality of dielectric elements comprise a first linear segment positioned adjacent the first side surface, a second linear segment positioned adjacent the second side surface and a non-linear segment positioned adjacent the back surface, the non-linear segment being connected to the first linear segment and the second linear segment.

17. The device of claim 16, wherein, when viewed from above, the non-linear segment has an arcuate configuration.

18. A device, comprising:
a layer of semiconductor material;
a first Bragg reflector structure positioned in the layer of semiconductor material, the first Bragg reflector structure comprising a plurality of dielectric elements and a first internal area defined by an innermost of the first plurality of dielectric elements; and an optical component positioned above the layer of semiconductor material, wherein at least a portion of the optical component is positioned within a vertical projection of the first internal area, wherein the optical component comprises a front surface, a back surface, a first side surface, a second side surface and, when viewed from above, an outer perimeter, wherein the device further comprises a second Bragg reflector structure positioned above an upper surface of the layer of semiconductor material and around at least a portion of the outer perimeter of the optical component, the second Bragg reflector structure comprising a plurality of upper elements positioned above the upper surface of the layer of semiconductor material and a second internal area defined by an innermost of the plurality of upper elements.

19. The device of claim 18, wherein the plurality of upper elements are arranged in a pattern that is a mirror image of a pattern of the plurality of dielectric elements.

20. The device of claim 18, wherein a layer of insulating material is disposed between the upper surface of the layer of semiconductor material and a lower surface of the optical component.

* * * * *